United States Patent
D'Achard Van Enschut et al.

(10) Patent No.: US 11,092,902 B2
(45) Date of Patent: Aug. 17, 2021

(54) METHOD AND APPARATUS FOR DETECTING SUBSTRATE SURFACE VARIATIONS

(71) Applicant: ASML Netherlands B.V., Veldhoven (NL)

(72) Inventors: Johannes Franciscus Martinus D'Achard Van Enschut, Eindhoven (NL); Tamara Druzhinina, Eindhoven (NL); Nitish Kumar, Eindhoven (NL); Sarathi Roy, Eindhoven (NL); Yang-Shan Huang, Veldhoven (NL); Arie Jeffrey Den Boef, Waalre (NL); Han-Kwang Nienhuys, Utrecht (NL); Pieter-Jan Van Zwol, Eindhoven (NL); Sander Bas Roobol, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/624,609

(22) PCT Filed: May 17, 2018

(86) PCT No.: PCT/EP2018/062980
§ 371 (c)(1),
(2) Date: Dec. 19, 2019

(87) PCT Pub. No.: WO2018/233951
PCT Pub. Date: Dec. 27, 2018

(65) Prior Publication Data
US 2020/0124977 A1 Apr. 23, 2020

(30) Foreign Application Priority Data

Jun. 21, 2017 (EP) .................................... 17177138
Sep. 15, 2017 (EP) .................................... 17191239

(51) Int. Cl.
*G03F 7/20* (2006.01)
*G01B 11/30* (2006.01)
(Continued)

(52) U.S. Cl.
CPC ............ *G03F 7/7065* (2013.01); *G01B 11/30* (2013.01); *G01N 21/47* (2013.01); *G01N 21/9501* (2013.01); *G03F 1/84* (2013.01)

(58) Field of Classification Search
CPC ............ G03F 7/70633; G03F 7/70625; G03F 7/7065; G03F 7/70683; G03F 9/7049;
(Continued)

(56) References Cited

U.S. PATENT DOCUMENTS 6,215,114 B1 4/2001 Yagi et al.
6,522,717 B1 2/2003 Murakami et al.
(Continued)

FOREIGN PATENT DOCUMENTS

KR 20180002779 A 1/2018
TW 201200863 A 1/2012
(Continued)

OTHER PUBLICATIONS

International Search Report and Written Opinion of the International Searching Authority directed to related International Patent Application No. PCT/EP2018/062980, dated Sep. 4, 2018; 10 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

Disclosed is a method and associated inspection apparatus for detecting variations on a surface of a substrate. The method comprises providing patterned inspection radiation to a surface of a substrate. The inspection radiation is
(Continued)

patterned such that an amplitude of a corresponding enhanced field is modulated in a manner corresponding to the patterned inspection radiation. The scattered radiation resultant from interaction between the enhanced field and the substrate surface is received and variations on the surface of the substrate are detected based on the interaction between the enhanced field and the substrate surface. Also disclosed is a method of detecting any changes to at least one characteristic of received radiation, the said changes being induced by the generation of a surface plasmon at said surface of the optical element.

14 Claims, 10 Drawing Sheets

(51) Int. Cl.
*G01N 21/47* (2006.01)
*G01N 21/95* (2006.01)
*G03F 1/84* (2012.01)

(58) Field of Classification Search
CPC ........ G03F 9/7065; G03F 9/7088; G03F 1/84; G03F 7/70441; G03F 7/70483; G03F 7/70941; G03F 9/7076; G03F 9/7092; G03F 9/7003; G03F 9/7019; G03F 9/7069; G03F 9/7073; G03F 9/7084; G03F 7/70616; G01N 21/956; G01N 21/9501; G01N 21/4788; G01N 21/95607; G01N 21/95623; G01N 2021/4704; G01N 2021/4711; G01N 21/47; G01N 2021/8829; G01N 21/8806; G01B 11/26; G01B 11/30; G01B 11/14; G01B 11/24; G01B 2210/56; G01B 11/27; G01B 11/028; G01B 11/03; G01B 11/06; G01B 11/2513

See application file for complete search history.

(56) References Cited

U.S. PATENT DOCUMENTS

| | | | |
|---|---|---|---|
| 9,194,811 | B1 | 11/2015 | Zhao et al. |
| 10,185,224 | B2 | 1/2019 | Zijp et al. |
| 2004/0042014 | A1 | 3/2004 | Feldman |
| 2006/0033921 | A1 | 2/2006 | Den Boef et al. |
| 2006/0066855 | A1 | 3/2006 | Boef et al. |
| 2006/0291059 | A1 | 12/2006 | Heyworth |
| 2009/0316979 | A1 | 12/2009 | Gidon |
| 2010/0201963 | A1 | 8/2010 | Cramer et al. |
| 2011/0027704 | A1 | 2/2011 | Cramer et al. |
| 2011/0037828 | A1 | 2/2011 | Wakamiya |
| 2011/0279805 | A1 | 11/2011 | Ryzhikov et al. |
| 2015/0198524 | A1 | 7/2015 | Sapiens et al. |
| 2015/0377795 | A1 | 12/2015 | Zhao et al. |
| 2016/0011523 | A1 | 1/2016 | Singh et al. |
| 2016/0061590 | A1 | 3/2016 | Pandey |
| 2016/0161245 | A1* | 6/2016 | Fu .................. G01B 11/24 250/208.2 |

FOREIGN PATENT DOCUMENTS

| | | |
|---|---|---|
| TW | 201606450 A | 2/2016 |
| TW | 201614188 A | 4/2016 |
| WO | WO 2011/161024 A1 | 12/2011 |
| WO | WO 2016/177568 A1 | 11/2016 |

OTHER PUBLICATIONS

International Preliminary Report on Patentability directed to related International Patent Application No. PCT/EP2018/062980, dated Dec. 24, 2019; 7 pages.
Bao, et al., "Visualizing nanoscale excitonic relaxation properties of disordered edges and grain boundaries in monolayer molybdenum disulfide," Nature Communications, vol. 6, No. 7993 (Aug. 13, 2015); pp. 1-7.
Bass, et al., Handbook of Optics: Fundamentals, Techniques, & Design, 2nd ed., vols. 1 and 2, Mc-Graw Hill Inc. (1995). (5 parts.).
Blumenstock, et al., "Ion-beam-deposited boron carbide coatings for the extreme ultraviolet," Applied Optics, vol. 33, No. 25 (Sep. 1, 1994); pp. 5962-5963.
Herbert, et al., "Table-Top EUV and Soft X-Ray Microsopy: Investigating Thin Film Nanostructures and Particles," Imaging & Microscopy (May 26, 2015); https://www.imaging-git.com/science/x-ray-analysis/table-top-euv-and-soft-x-ray-microscopy.
"Curved mirror optics," X-ray Optics (last accessed Jan. 16, 2020); http://www.x-ray-optics.de/index.php/en/types-of-optics/reflecting-optics/curved-mirrors.
"Image based fast tip/tilt estimation of a substrate with respect to an optical element," Research Disclosure, vol. 627, No. 64 (Jun. 23, 2016); 6 pages.
"Near-field scanning optical microscope," Wikipedia (edited on Jul. 26, 2019); https://en.wikipedia.org/w/index.php?title=Near-field_scanning_optical_microscope&oldid=907926159.

* cited by examiner

METHOD AND APPARATUS FOR DETECTING SUBSTRATE SURFACE VARIATIONS

CROSS-REFERENCE TO RELATED APPLICATIONS

This application claims priority of EP application 17177138.9 which was filed on Jun. 21, 2017 and EP application 17191239.7 which was filed on Sep. 15, 2017 which are incorporated herein in its entirety by reference

FIELD

The present invention relates to a method and apparatus for inspecting substrate surfaces, and in particular for detecting substrate surface variations.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay (the accuracy of alignment between patterns formed in different patterning steps, for example between two layers in a device) and defocus of the lithographic apparatus. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g. reconstruction of the target structure by iterative approaches such as rigorous coupled wave analysis or finite element methods; library searches; and principal component analysis.

Examples of known scatterometers include angle-resolved scatterometers of the type described in US2006033921A1 and US2010201963A1. The targets used by such scatterometers are relatively large, e.g. 40 µm by 40 µm, gratings, and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Methods and scatterometers are also disclosed in US20110027704A1, US2006033921A1 and US2010201963A1. With reduction of the physical dimensions in lithographic processing, there is demand to inspect smaller and smaller features, and also demand to reduce the space occupied by targets dedicated to metrology. The invention is not limited in application to any particular type of inspection apparatus, or even to inspection apparatuses generally. The contents of all these applications are incorporated herein by reference.

An example of an angularly resolved scatterometer comprising a Solid Immersion Lens (SIL) is disclosed in published patent application US2009316979A1. The extreme proximity of the SIL with the target results in a very high effective NA larger than 1. The application of such a SIL in an inspection apparatus for semiconductor metrology is disclosed in published patent application US2016061590A1. To take advantage of the increasing numerical aperture, the gap between the SIL and the target needs to be set and maintained to an optimal value. For example, the gap may be a few tens of nanometers, for example within the range 10-100 nm to maintain the SIL in the near field of optical interaction with the substrate. Arrangements for controlling the height of the SIL element are described in the published patent application and in a not yet published international patent application PCT/EP2016/058640 (filed Apr. 19, 2016; not published at the priority date of the present application). The contents of all the mentioned applications are also incorporated herein by reference.

At present, no commercially available apparatuses are available that are effectively and efficiently able to detect nanometer-scale defects and variations across the entire surface of a substrate with sufficient precision and speed. In order to be commercially viable, defects having a size smaller than 40 nm must be detectable within a positional accuracy of approximately 10 nm and preferably less. Furthermore, for commercial viability reasons, it is desirable to be able to perform a measurement of an entire substrate surface in approximately 1 hour.

While apparatuses exist that fulfil some of these requirements, there are presently no commercially available apparatuses that fulfil all three requirements simultaneously.

SUMMARY

In a first aspect of the invention, there is provided a method for detecting variations on a surface of a substrate, the method comprising: providing inspection radiation to a surface of a substrate wherein the inspection radiation is patterned such that an amplitude of a corresponding enhanced field is modulated in a manner corresponding to the patterned inspection radiation; receiving scattered radiation resultant from interaction between the enhanced field and the substrate surface; and detecting variations on the surface of the substrate based on the interaction between the enhanced field and the substrate surface.

In a second aspect of the invention there is provided a method for detecting variations on a surface of a substrate, the method comprising: providing inspection radiation to a surface of an optical element at an angle configured to create an enhanced field; positioning the surface of the optical element within a distance smaller than a wavelength of the patterned inspection radiation to the surface of the substrate; receiving said inspection radiation following reflection by the optical element; and detecting any changes to at least one characteristic of the received radiation, the said changes being induced by the generation of a surface plasmon at said surface of the optical element.

In a third aspect of the invention there is provided an for detecting variations on a surface of a substrate, the apparatus comprising: an illumination system operable to provide an inspection radiation; patterning means configured to pattern the inspection radiation such that an amplitude of a corresponding enhanced field is modulated in a manner corresponding to the patterned inspection radiation; and a first detector operable to detect scattered radiation caused by interaction between the patterned enhanced field and the substrate surface.

In a fourth aspect of the invention there is provided an inspection apparatus for detecting variations on a surface of a substrate, the inspection apparatus comprising: an optical element; an illumination system operable to provide an inspection radiation to a surface of the optical element at an angle configured to create an enhanced field; a first detector operable to detect received radiation caused by interaction between the patterned evanescent field and the substrate surface; and processing means being operable to detect any changes to at least one characteristic of the received radiation, the said changes being induced by the generation of a surface plasmon at said surface of the optical element.

In a fifth aspect of the invention, there is provided a near-field scanning optical microscopy method for detecting variations on a surface of a substrate, the method comprising: providing inspection radiation to a surface of a substrate; and detecting resultant scattered radiation having scattered from the substrate, wherein said detecting is performed from within a distance, relative to the surface of the substrate, smaller than a wavelength of the inspection radiation, thereby creating an evanescent field.

In a sixth aspect of the invention, there is provided a near-field scanning optical microscopy apparatus for detecting variations on a surface of a substrate, the apparatus comprising: an illumination system for providing inspection radiation to a surface of a substrate; and an array of optical microscopy detectors for detecting resultant scattered radiation having scattered from the substrate, wherein said array of optical microscopy detectors is located when in use, within a distance, relative to the surface of the substrate, smaller than a wavelength of the inspection radiation, thereby creating an evanescent field.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
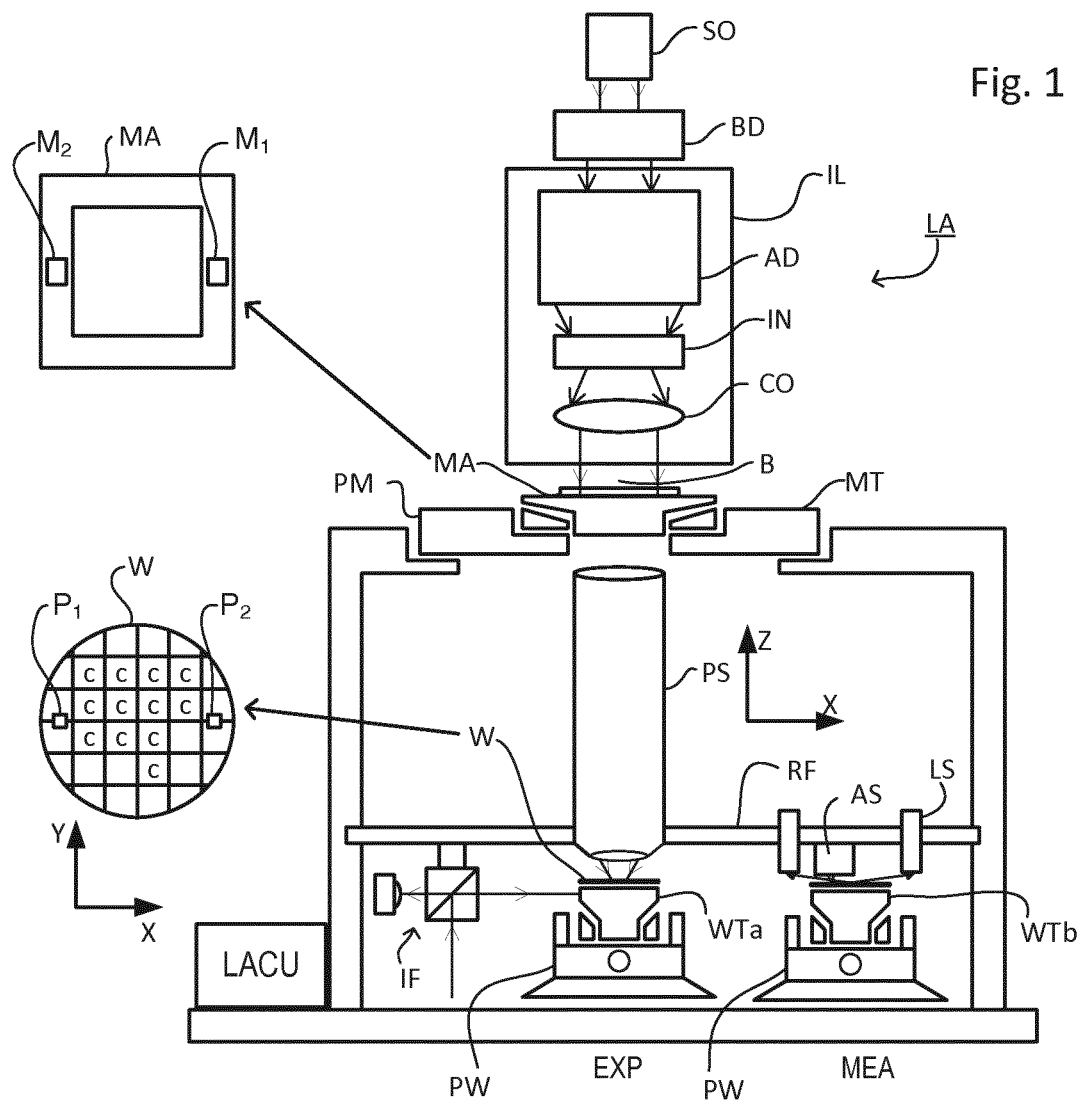
FIG. 1 depicts a lithographic apparatus.

FIG. 1 schematically depicts a lithographic apparatus LA. The apparatus includes an illumination system (illuminator) IL configured to condition a radiation beam B (e.g. UV radiation or DUV radiation), a patterning device support or support structure (e.g. a mask table) MT constructed to support a patterning device (e.g. a mask) MA and connected to a first positioner PM configured to accurately position the patterning device in accordance with certain parameters; two substrate tables (e.g. a wafer table) WTa and WTb each constructed to hold a substrate (e.g. a resist coated wafer) W and each connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well-known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g., after mechanical retrieval from a mask library, or during a scan.

Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies. Small alignment marks may also be included within dies, in amongst the device features, in which case it is desirable that the marks be as small as possible and not require any different imaging or process conditions than adjacent features. The alignment system, which detects the alignment marks, is described further below.

The depicted apparatus could be used in a variety of modes. In a scan mode, the patterning device support (e.g, mask table) MT and the substrate table WT are scanned synchronously while a pattern imparted to the radiation beam is projected onto a target portion C (i.e. a single dynamic exposure). The speed and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual-stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment marks on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems.

Figure 2:
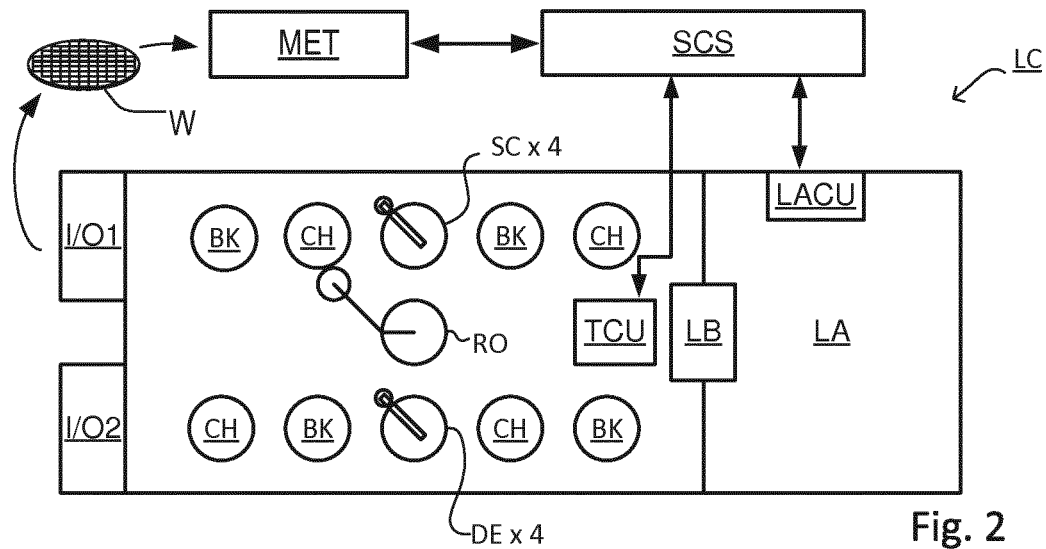
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO, picks up substrates from input/output ports I/O1, I/O2, moves them between the different process apparatus and delivers then to the loading bay LB of the lithographic apparatus. These devices, which are often collectively referred to as the "track", are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
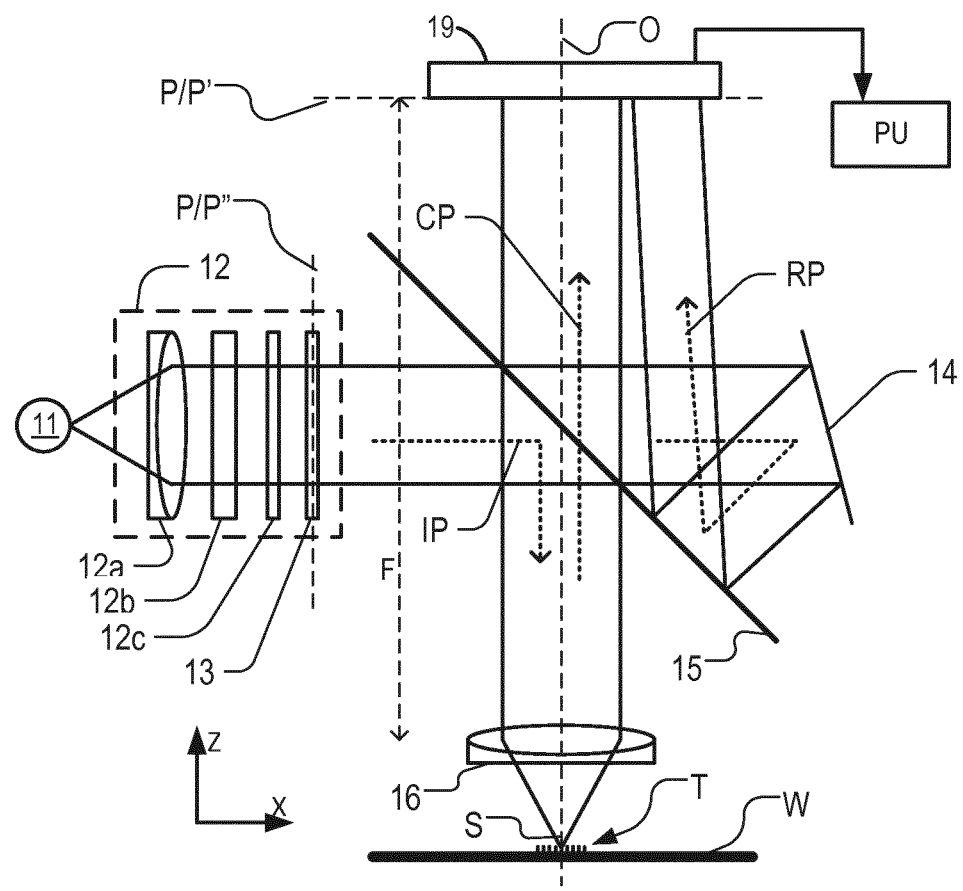
FIG. 3 depicts a first example of an inspection apparatus arranged to perform angle-resolved scatterometry.

FIG. 3 shows the basic elements of a known angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired. Further increases in NA can be obtained by use of solid immersion lens (SIL) techniques, including micro-SIL and equivalents.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system are being brought to different locations on the substrate, when in practice the optical system remains substantially stationary and only the substrate moves. Provided the relative position of the substrate and the optical system is correct, it does not matter in principle whether one or both of those is moving in the real world.

Part of the radiation beam is transmitted through the partially reflecting surface 15 and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the pupil plane P of lens 16, which is at the back-focal length F of the lens 16. In practice, the pupil plane itself may be inaccessible, and may instead be re-imaged with auxiliary optics (not shown) onto the detector located in a so-called conjugate pupil plane P'. The pupil plane P may also be referred to as the back focal plane. The detector may be a two-dimensional detector so that a two-dimensional angular scatter spectrum or diffraction spectrum of a substrate target T can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

Returning to the known apparatus, the various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P''' conjugate with pupil plane P of objective lens 16 and the plane of the detector 19. In this way, an illumination profile defined by the aperture device defines the angular distribution of light incident on substrate radiation passing through different locations on aperture device 13.

The detector 19 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic-polarized light and transverse electric-polarized light.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes. The techniques disclosed herein are not limited to inspection of grating structures, and any target structure, including a blank substrate or a substrate having only flat layers on it, or a substrate with an isolated structure (for example contamination or other defects) is included within the term "target structure".

In addition to measurement of parameters by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement using the instrument of FIG. 3 are described for example in published patent application US2006066855A1 cited above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 3, where detector 19 may be an image sensor, such asymmetry in the diffraction orders appears directly as asymmetry in the pupil image recorded by detector 19. This asymmetry can be measured by digital image processing in unit PU, and calibrated against known values of overlay.

Figure 4:
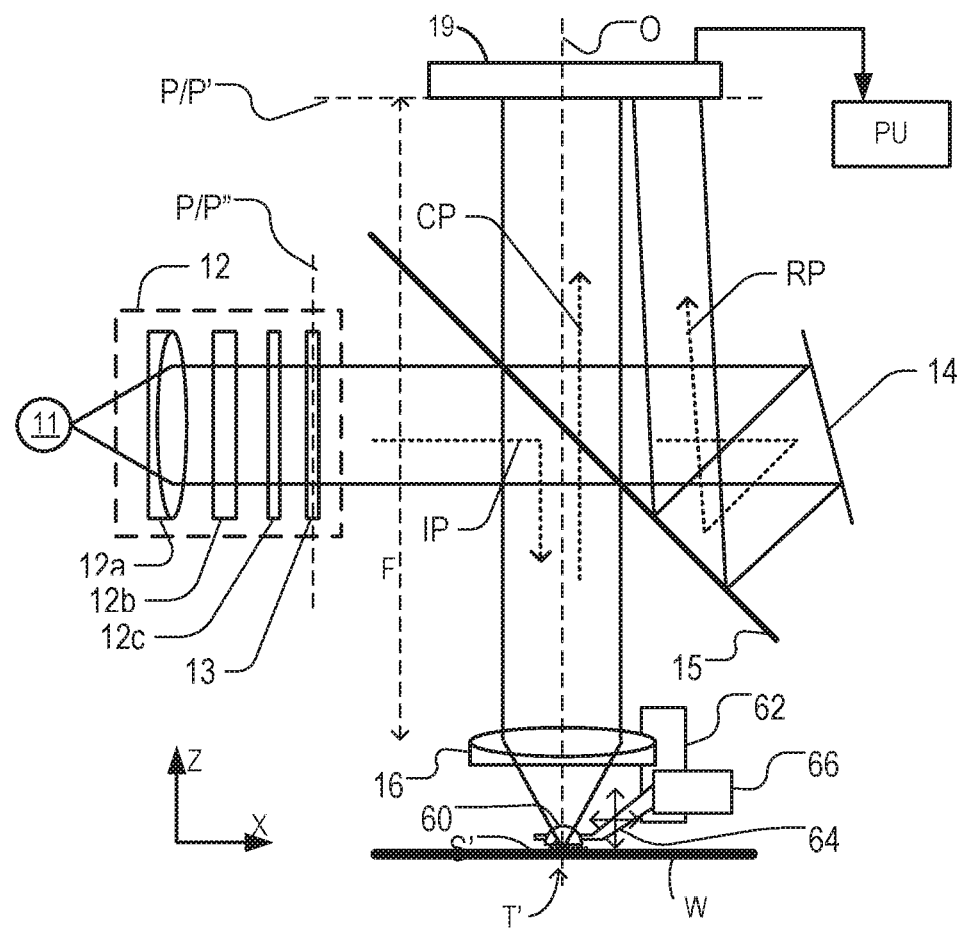
FIG. 4 depicts an example of an inspection apparatus arranged to perform angle-resolved scatterometry, in which an optical system includes a solid immersion lens (SIL), as an example of an optical system in which embodiments of the present invention may be applied.

FIG. 4 shows a modified version of the scatterometer of FIG. 3, in which a smaller spot S' of illumination can be applied to a smaller grating target T', which has lines of smaller pitch. Components are labeled the same as in the scatterometer of FIG. 3.

Comparing the apparatus of FIG. 4 with that of FIG. 3, a first difference is the provision of an additional lens element 60 close to the target T'. This additional lens is a miniature solid immersion lens (SIL), with a diameter only on the order of a millimeter, for example in the range 1 mm to 5 mm, for example about 2 mm. This comprises in one example a hemisphere of material such as glass of refractive index n that receives rays of light at normal incidence to its surface. These rays come to focus at the center of the hemisphere and form a diffraction-limited spot that is smaller by a factor of n compared to what it would have been in the absence of the SIL. A typical glass hemisphere having n=2 will reduce the diameter of the focused spot by a factor of 2. Immersion of lenses in liquid has been used to increase resolution in microscopy and photolithography. The solid immersion lens has been proposed in microscopy and in lithography as a way of achieving similar gains without the inconvenience of liquid immersion.

Benefits of inspection using an apparatus comprising a SIL and coherent radiation are described for example in US2009316979A1, and US2016061590A1, cited above. However, to ensure that the smaller spot size does indeed increase the resolution of the system, the bottom of the hemisphere must either be in contact with the target T' or positioned extremely close to it, within a fraction of a wavelength of the inspection radiation. This renders the apparatus more susceptible to the effects of defects, surface contaminants or other surface variations of substrates under measurement, thereby potentially restricting its practical applications.

So-called micro-SIL lenses may also be used, of which the diameter is many times smaller, for example about 2 microns in diameter instead of about 2 millimeters. In an example where SIL 60 in the FIG. 4 apparatus is a micro-SIL lens, it may have a diameter less than 10 µm, potentially less than 5 µm.

Whether a miniature SIL 60 or a micro-SIL lens is used, it can be attached to a movable support so that to control the alignment and proximity to the sample is much simpler than in the case of a lens with bigger diameter. SIL 60 in FIG. 4 is mounted to a frame 62 supporting objective 16 via an arm 64 and actuator 66. Actuator 66 may be piezoelectric in operation, for example, or voice-coil actuated. It may operate in combination with other actuators positioning the objective as a whole in relation to the target. In relation to the coarse and fine positioners mentioned above, for example, the actuator 66 and arm 64 may be regarded as an ultra-fine positioner. The skilled person will appreciate that servo control loops of these different positioners can be integrated with one another in a manner that need not be described here. The components 62, 64 and 66, together with the substrate table and positioners (mentioned above but not shown), form a support apparatus for positioning the SIL and the target T' in close proximity to one another. In principle, SIL 60 could be mounted rigidly to the frame 62, and/or may be of bigger diameter. The separate arm and actuator allow easier control of the very small gap, as discussed below.

The form of the mounting arm 64 and actuator 66 illustrated here are purely schematic. A practical implementation of a mounting and actuator 66 is described in the international patent application PCT/EP2016/058640, mentioned above.

Inclusion of the SIL 60 opens the possibility of focusing to a much smaller spot S'. As mentioned, the SIL works by capturing the near-field radiation from the target, and to this end it is positioned substantially closer than one wavelength (λ) of radiation from the target structure, generally closer than a half wavelength, for example, less than one-tenth of a wavelength or around λ/20. The closer the distance, the stronger will be the coupling of near-field signals into the instrument. The air gap between SIL 60 and target T' may therefore be less than 100 nm, for example between 10 nm and 50 nm. Because the NA of the scatterometer is effectively increased, the pitch of the target grating can also be reduced closer to product dimensions, while still capturing a large angular spectrum of the diffraction signals. Alternatively, the pitch can be maintained while capturing a larger angular range of the diffraction signal.

In examples where a micro-SIL would be used, incoherent radiation of the type conventionally used in the scatterometers cannot be focused to a micron-sized spot as small as the micro-SIL. Accordingly, in such an embodiment, the light source 11 may be a coherent source such as a laser. A laser source may be coupled to illumination system 12 via an optical fiber. The limit on the spot size is set by the numerical aperture of the focusing lens system and the laser wavelength. As mentioned in US2016061590A1, the instrument with laser light source can be used to perform different types of scatterometry, for example, coherent Fourier scatterometry (CFS).

Typically, almost all of the radiation impinging on the objective lens 16 is transmitted through the objective lens 16. With the SIL 60 present, however, not all the angles of rays incident on the SIL are transmitted through the SIL. On the contrary, total internal reflection (TIR) occurs for rays above a critical angle of incidence, depending on the relative refractive index of the SIL and the surrounding medium.

Figures 5A, 5B, 5C:
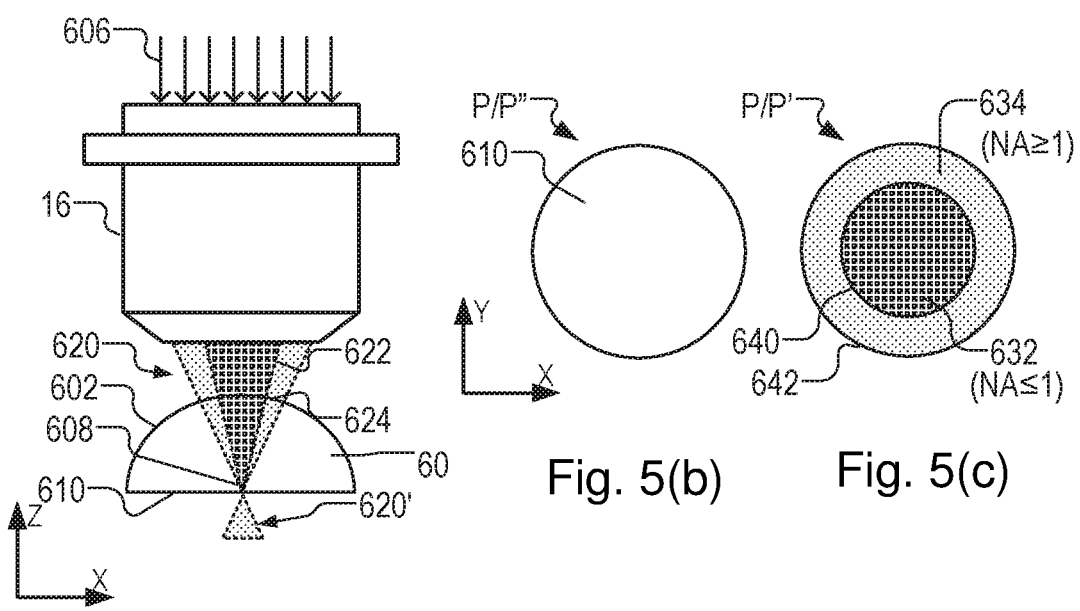
FIGS. 5(a), 5(b) and 5(c) show in more detail characteristics of the optical system of the apparatus of FIG. 4, including the solid immersion lens.

FIGS. 5(*a*), 5(*b*) and 5(*c*) illustrate this phenomenon in more detail. In the X-Z cross-section for FIG. 5(*a*) SIL 60 is shown having a hemispherical upper surface 602 facing objective lens 16 and with a planar lower surface 610 facing the target T'. Rays 606 of illuminating radiation are focused by lens 16 to a focal point 608 inside the SIL 60, nominally positioned at lower surface 610. Methods and apparatuses for controlling this focusing are described in the pending international application PCT/EP2016/058640, mentioned above.

FIG. 5(*b*) shows schematically an illumination profile 610 in the plane P/P''' in FIG. 4. FIG. 5(*c*) shows schematically a distribution of collected radiation in the plane P/P', assuming no target structure is in the vicinity of SIL 60. If the illumination profile 610 is a full, circular distribution as shown, then a cone of rays 620 is formed by the focusing action of objective lens 16, as seen in the X-Z cross-section of FIG. 5(*a*). This cone of rays includes a central portion 622 in which rays meet the lower surface 610 of SIL 60 at angles below the critical angle for total internal reflection. The cone of rays also includes an outer portion 624 in which rays meet the lower surface 610 of SIL 60 at angles above the critical angle for total internal reflection.

The critical angle is defined by the equation:

$$\theta_c = \sin^{-1}\left(\frac{n_2}{n_{sil}}\right)$$

where $n_2$ is the surrounding medium (assumed to be air) and $n_{sil}$ is the refractive index of the SIL. The boundary where the critical angle occurs corresponds (by definition) to an NA of 1 in the overall system of lens 16 and SIL 60.

In the presence of a target structure very close to the lower surface 610 of SIL 60, the total internal reflection is frustrated. The principle behind this will be described in more detail in the following. As a result, rays 620 from both portions of the illumination cone 620 can interact with the target structure. This gives the overall system of lens and SIL an NA greater than 1. In the absence of a target structure, however, the rays in the outer cone experience total internal reflection at the lower surface 610 of SIL 60, and are strongly reflected back towards objective lens 16. FIG. 5(*c*) shows how the collected radiation in plane P/P' includes a dark central region 632, corresponding to NA values below 1. Here, most rays have passed out of the SIL 60 and only the ghost image caused by Fresnel reflections is present (note that no substrate is present to reflect radiation back towards objective lens 16 in this example, and therefore illumination cone 620' passes out of the system). In a bright outer region 634 corresponding to NA values greater than 1, most rays have been reflected back by total internal reflection.

Total internal reflection is typically undesirable in known systems when performing measurements on target structures, since it may contribute to ghost images or reflections that have to be removed. However, it has been realized that total internal reflection may be utilized to perform defect inspection on a substrate.

Figure 6A:
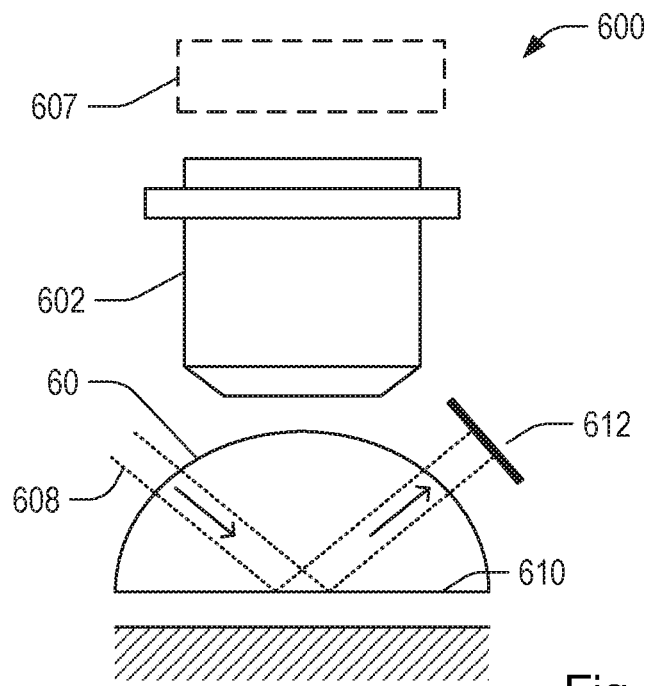
FIGS. 6(a) and 6(b) shows a measurement principle according to an aspect of the present disclosure.
Figure 6B:
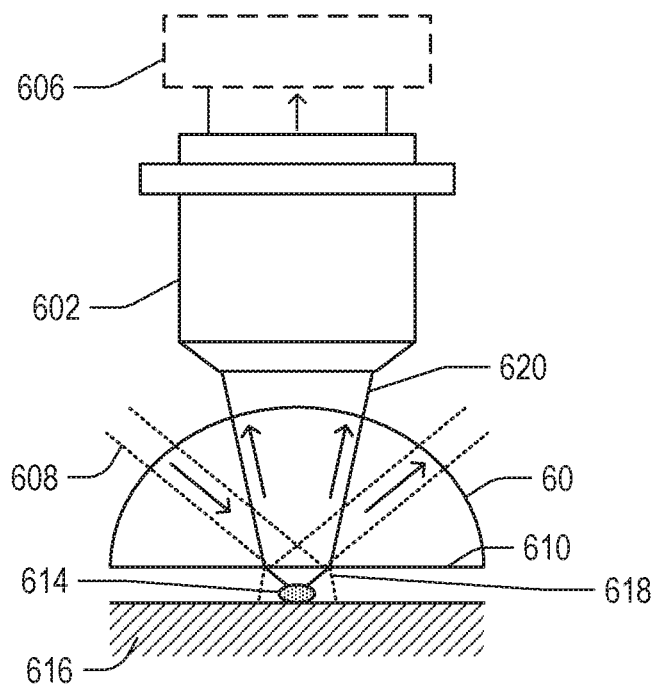

FIGS. 6(*a*) and 6(*b*) illustrate the principle of the present disclosure. In this example, an optical system 600 (e.g. a system similar to that described with reference to FIG. 3 or 4) comprising an objective lens 602 and a SIL 60. The optical system additional comprises a number of additional optical, detecting and processing components 607 (e.g. the optical system and detection/processing elements described in FIG. 4), which are omitted from FIG. 6 for purposes of conciseness and clarity.

Turning specifically to FIG. 6(a), radiation 608 is provided to the SIL 60 at an angle that is larger than the critical angle $\theta_c$. Accordingly, the radiation is reflected by an lower surface 610 of the SIL by total internal reflection in a manner similar to that described with respect to FIG. 5 above. However, unlike the radiation in the examples above, the radiation is not provided by way of the illumination system that delivers radiation to the objective lens 602. Rather, it is provided by a second radiation source (not shown), and, in some examples, a corresponding second illumination system (not shown). An example of such a second illumination system will be described in more detail in the following. By using a separate radiation source, it becomes possible to use angles of incidence that would not be possible by using the objective lens. Additionally, it is possible to control the angle of incidence of the radiation, e.g. to take into account a change in material or system characteristics, without affecting the operation of the remainder of the apparatus. To prevent the totally internally reflected radiation from negatively influencing other components of the apparatus on exiting the SIL 60, it may be blocked or diverted, for example by a beam dump 612 or a similar component, in a suitable manner. Alternatively a detector may be used to detect this radiation; the detected signal may provide more defect detection opportunities.

Figure 7A:
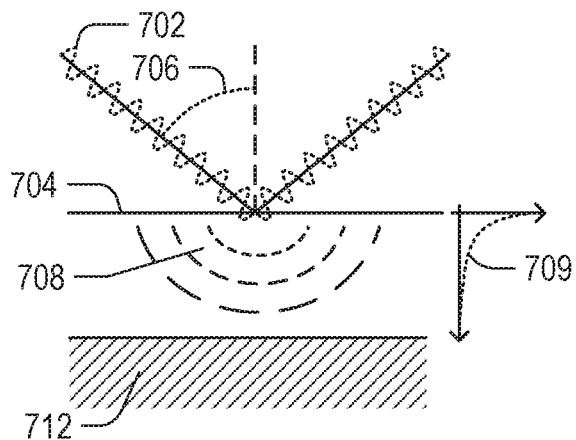
FIGS. 7(a) and 7(b) illustrates a mechanism for generating an enhanced field.
Figure 7B:
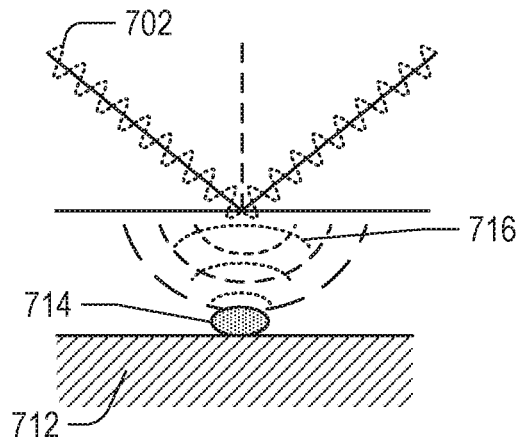

However, if a defect 614 or other surface variation (such as surface contaminants or particles) is present on the surface of a substrate under measurement 616, the total internal reflection will be affected. This is illustrated in FIG. 7(b). In the following, reference will be made to a "defect", although it will be appreciated that this is not intended to be limiting and is merely for exemplary purposes; other surface variations may be detected in this manner.

Once the defect 614 enters the area beneath SIL, the total internal reflection will be frustrated and at least part of the radiation will not reflected by the inner surface 610 of the SIL. A part 618 of the radiation is effectively transmitted through the inner surface of the SIL where it may interact with and be scattered by the defect. At least a part of said scattered radiation 620 is scattered by the defect in such a manner that the objective lens is able to receive said radiation. This allows the scattered part of the radiation to be detected using the optical system of the inspection apparatus. In other terms, during substrate inspection, if radiation is detected by the optical system of the inspection apparatus, this is indicative of a particle (or other defect) on the surface of the substrate.

In the above examples, frustrated total internal reflection is used to enable defects on the surface of a substrate to interact with incoming radiation. The principles of frustrated total internal reflection, as used in embodiments of the present disclosure, will now be described in more detail with reference to FIGS. 7(a) and 7(b).

Radiation 702 propagating towards a surface 710 at an angle of incidence 706 larger than the critical angle will, as described above, be totally internally reflected by the optical surface. Accordingly, under normal circumstances, substantially all of the incoming radiation is reflected by the surface. Additionally, a so-called evanescent field 708 is generated. The evanescent field extends beyond the optical surface, but decreases exponentially in intensity (as shown by the graph 709). It will be appreciated that the exact drop-off function is dependent on one or more specific characteristics of the system and the radiation. Under normal circumstances, when no defects or surface contaminants are present on the surface of a substrate under measurement 712, the evanescent field is not interfered with.

However, when a defect 714 enters the evanescent field, it will cause radiation energy to be transferred from the optical surface to the defect 714. In other terms, despite having an angle of incidence larger than the critical angle, some of the radiation is transmitted through the optical surface. This phenomenon is known as "frustrated total internal reflection". The transmitted radiation may the subsequently interact with the defect. In the present example, transmitted radiation is scattered by the defect. This scattered radiation 716 may, in some examples, propagate back towards the optical surface and be transmitted therethrough.

The scattered radiation may subsequently be collected by a suitable optical system. As no radiation is scattered in the absence of particles or other surface variations, the mere presence of scattered radiation can be used as an indicator of a particle or other surface variation. Any suitable optical system may be used to collect the scattered radiation, dependent on the characteristics of the optical system and the radiation.

Figure 8:
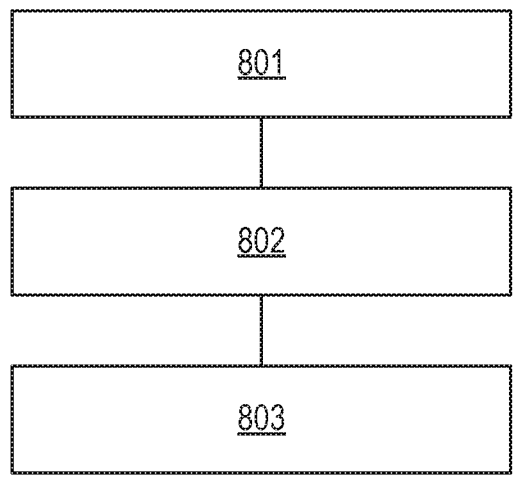
FIG. 8 is an exemplary method according to an aspect of the present disclosure.
Figure 9:
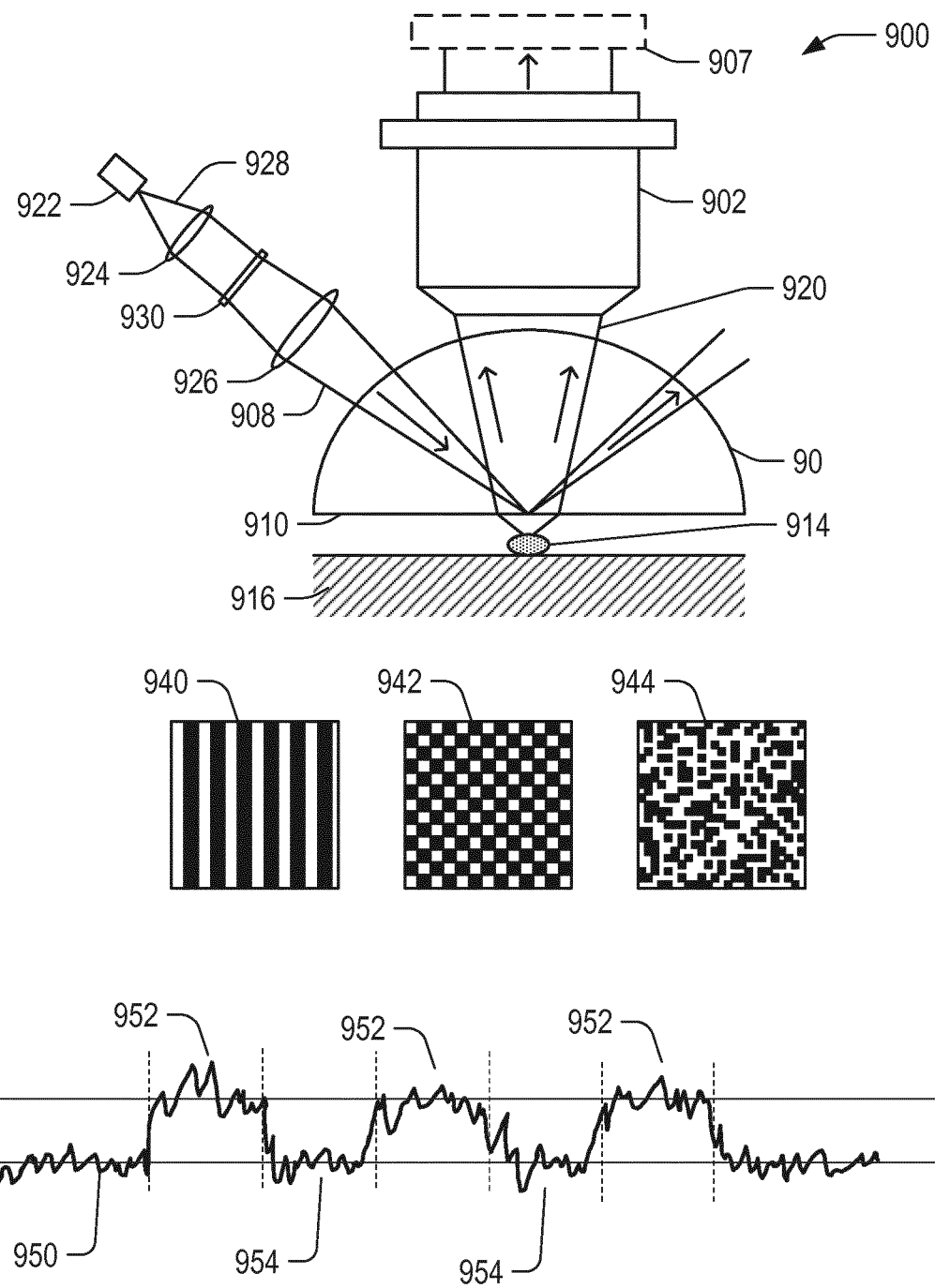
FIG. 9 is a measurement apparatus according to an aspect of the present disclosure.

A first exemplary method and apparatus 900 for detecting a defect 914 or other surface variations on a substrate according to the present disclosure will now be described with reference to FIGS. 8 and 9. For ease of comparison with FIG. 6, elements of FIG. 9 similar to corresponding elements of FIG. 6 are labelled with reference signs similar to those used in FIG. 6, but with prefix "9" instead of "6".

In a first step 801, a patterned radiation 908 beam is provided. The patterned inspection radiation has a first pattern. The patterned inspection radiation may be provided in any suitable fashion. For example, the patterned radiation may be provided by an illumination system comprising a radiation source 922 and one or more optical components 924, 926 (e.g. beam shaping or modifying components).

The first pattern of the patterned inspection radiation may be provided in any suitable fashion. In the example illustrated here, the step of providing comprises: providing an input inspection radiation 928; and modifying the input inspection radiation by using a patterning component 930 having a first pattern. However, as will later be described, the patterning component may alternatively be located on the lower surface 910 of SIL 90. The patterning component may apply the first pattern in any suitable fashion. The effect of the patterning component 930 (wherever located) is to provide an intensity modulation in an enhanced field generated at level of surface 910, corresponding to the pattern imparted by the patterning component.

The patterned radiation may have a pattern imparted in terms of intensity (i.e., the patterning component 930 imparts an intensity modulation to obtain the patterned radiation). Alternatively, or in addition, another inspection radiation parameter may be patterned by the patterning component 930. For example a suitable patterning component may impose a phase modulation (where the source is a coherent source) and/or a polarization modulation instead of, or additional to, an imposed amplitude modulation. In the case of a phase modulation, techniques similar to those used in structured illumination microscopy may be used to pattern the inspection radiation and to process the resultant signal. In each case, a corresponding intensity modulation in the enhanced field will be generated at level of surface 910.

The patterning component 930 may apply any suitable pattern to the input inspection radiation. In some examples, the first pattern is a periodic pattern. In an example, the first pattern is linearly periodic in a first direction. The first direction may be oriented in any suitable direction relative to any part of the apparatus. In an example, the first direction is parallel to a relative movement direction of the apparatus relative to the substrate (e.g. a scanning direction of a lithographic apparatus). In another example, the periodic pattern is a two-dimensional periodic pattern. The first pattern may have any periodicity (or plurality of periodicities). In an example, at least one of the periodicities of the first pattern is constant. In another example, at least one of the periodicities of the first pattern is varying. In an example, at least one of the periodicities of the first pattern is substantially similar to a characteristic of the substrate and/or an expected type of defect or variation.

In other examples, the patterned radiation comprises a non-periodic pattern. In some examples, the pattern is a one-dimensional periodic pattern 940. In other examples, the pattern is a two-dimensional periodic pattern 942. In yet other examples, the pattern is non-periodic two-dimensional pattern 944. The pattern may, in some examples, have one or more characteristics that are intended to provide one or more specific effects. In other examples, the pattern is optimized for detecting defects having a certain set of characteristics (e.g. defects with dimensions being within a particular set of thresholds) or of a particular type (e.g. surface contaminants or dents). Additionally or alternatively, the pattern may be optimized according to characteristics of the input inspection radiation (e.g., wavelength and/or polarization and/or incident angle). Additionally or alternatively, the pattern may be optimized according to a specific application.

The patterned inspection radiation 908 is typically provided to a suitable optical surface 910, e.g., by being imaged onto the surface 910, in focus, at an illumination angle below the critical angle. In an example, the patterned inspection radiation 908 is provided to an optical component having a first optical surface 910, the first optical surface 910 being positioned at a first distance from the substrate 916. The patterned inspection radiation is provided at an angle relative to the optical surface 910 that is larger than the critical angle, thereby to cause total internal reflection (as described above). In reality, the radiation comprising the patterned inspection radiation 908 may be incident on the optical surface 910 at a plurality of specific angles, dependent on the characteristics of the radiation and the optical system. It will be appreciated that, although a SIL 90 is discussed in the present examples, the principles of the present disclosure could be implemented in any optical system having a suitable optical surface.

In a second step 802, the patterned inspection radiation is used to generate an enhanced field at the substrate 916 surface. The step of using may be implemented in any suitable fashion. In an example, such as the one described above, the step of using comprises: providing the patterned inspection radiation to an optical component having a first optical surface, the first optical surface being positioned at a first distance from the substrate; and generating the enhanced field by total internal reflection of the patterned radiation at the first optical surface. The step of using may be implemented so as to generate any suitable enhanced field. In an example, the enhanced field is an evanescent field that is generated as substantially discussed above with reference to FIGS. 7(*a*) and 7(*b*).

In examples wherein patterned radiation is utilized, such a pattern will be substantially transferred to the enhanced field as a variation in the field strength of the enhanced field. In some examples, the enhanced field is only generated in "bright" or high intensity parts of the pattern. Accordingly, no enhanced field is generated for "dark" (or low intensity) parts of the pattern. In specific examples, no radiation at all is transmitted in the dark parts of the pattern. In effect, the radiation pattern is reproduced in the enhanced field.

In a third step 803, scattered radiation 920 caused by interaction between the enhanced field and the substrate surface is received at a first detector. The detector may be any suitable detector using any suitable detection mechanism. In an example, an existing optical system 902, 907 with a detector may be used (which may take the form of the optical system of the inspection apparatus shown in FIGS. 3 and 4 above). The detection may be performed in an image plane (dark-field measurement) or in a pupil or Fourier plane (bright field measurement) of a metrology apparatus.

The use of a patterned beam (or more specifically the generation of a modulated enhanced field) is useful in itself in that it increases interaction between the substrate (sample) being measured and the incident radiation. A patterned beam (illumination specific) can be used to increase the sensitivity of the scattering signal by selecting the specific scattered radiation, which can be pattern and particle dependent. By knowing the changes in the radiation beam resultant from the imposed pattern, it becomes easier to determine changes due to a defect. However, the main advantages are achieved as a result of scanning the substrate within the modulated enhanced field such that the substrate is moved relative to the modulated enhanced field. This may be achieved by moving the substrate, moving the SIL 90 or moving both.

Scanning the substrate within the modulated enhanced field provides increased signal-to-noise characteristics of the measured signal, allowing for detection of much smaller particles than would otherwise be possible. When the SIL is scanned over the surface of the substrate, any defect will "see" and scatter the coded intensity pattern of the modulated enhanced field. Therefore, by using a known pattern while scanning the particle, the resultant scattered signal received is a convolution of the incident field and the scatterer (e.g., defect). This enables an increase in the total amount of signal detected while also reducing the amount of noise by multiple sampling and synchronous detection to the imposed pattern, for example. This is illustrated by the trace of (e.g., integrated) intensity (y-axis) 950 against displacement (x-axis) in the scanning direction using (for example) a one-dimensional periodic pattern 940. The trace shows three peaks 952 and two troughs 954. Each peak 952 corresponds to detection of the same defect 914 by a "bright" or high intensity part of the periodic pattern where the enhanced field is generated, and therefore each peak 952 can be treated as a different signal sample of the same defect. Each trough corresponds to the "dark" or low intensity part of the periodic pattern where the enhanced field is not generated, and therefore total internal reflection is not frustrated even in the presence of the defect. These intensity values for the toughs 954 may provide a measure of baseline intensity measurement of a defect in the absence of an enhancement field.

A number of methods are available for processing the resultant signal. The signal may be statistically processed (e.g., averaging the signal over the peaks and localizing). Autocorrelation (e.g., multi-pass correlation) techniques can then be utilized on the multiple signal samples to detect with higher accuracy whether a measured signal relates to the presence of anomalous disturbances (e.g., defects). Other processing methods may comprise one or more of: synchronous detection using a patterned SIL surface, determining the difference between the zero signal and/or determining a deconvolution of the imposed pattern. signal and differential signal. Of course, processing will also depend on how the pattern is imparted onto the inspection radiation; and therefore processing may comprise determining coherence and phase difference (phase sensitive detection) or a polarization difference (polarization sensitive detection) in the measured signal, as appropriate. These differences can be used in the same manner as determined intensity differences, as described.

As previously mentioned, the methods and apparatuses described above in relation to FIGS. 8 and 9 may be adapted such that the patterning of the inspection radiation, and therefore the modulation of the enhanced field, is performed by a patterning component integrated within the SIL 90, i.e., on the lower surface 910 (for example, comprised within an enhancing layer on the SIL). In such an embodiment, patterning component 930 may be absent. The one or more enhancing layers may be applied to any suitable or relevant portion of a suitable optical surface of the optical component. In some examples, an enhancing layer is applied to the entirety of the optical surface. In other examples, an enhancing layer is applied to only a portion of the optical surface of the optical component.

A first example of a SIL with an enhancing layer will now be described with reference to FIGS. 10(a), 10(b) and 10(c). In the present example, the enhancing layer has been applied to substantially the entirety of the surface of the SIL. However, it will be appreciated that the enhancing layer may equally well be applied to only a part of the surface.

Figure 10A:
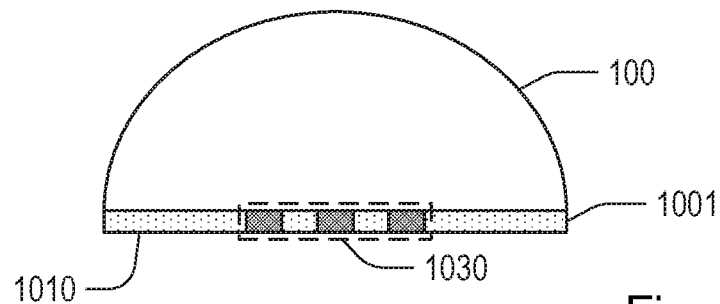
FIGS. 10(a), 10(b) and 10(c) illustrate an exemplary enhancing layer usable in combination with an optical element in embodiments of the invention.
Figure 10B:
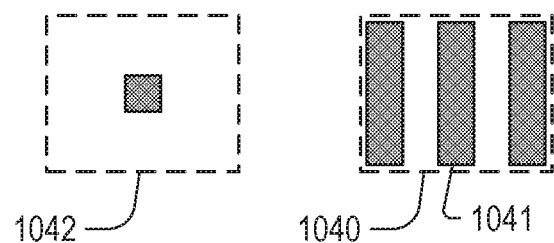

FIG. 10(a) illustrates a SIL 100 comprising an enhancing layer 1001 having integrated therein a patterning component 1030. This patterning component 1030 works in essentially a similar manner to patterning component 930 in that it generates a modulated enhanced field (the modulation essentially corresponding to the pattern) along the lower surface 1010 of SIL 100. Once again, the patterning of the radiation incident on the patterning component 1030 may impose a modulation in terms of one or more of: intensity, phase or polarization.

The pattern may have any suitable properties or characteristics. In one example, areas of the enhancing layer comprising the pattern may have different optical properties than areas to which the pattern has not been applied. For example, patterned areas may have a different refractive index than unpatterned areas. In another example, patterned areas are opaque to at least a portion of the radiation, and unpatterned areas are transparent to the radiation.

Any suitable pattern may be applied to the enhancing layer. FIG. 10(b) illustrates a number of exemplary patterns which may be applied to the enhancement layer. The first exemplary pattern 1042 is a single square that is positioned substantially at the center of the surface of the SIL. The square may have any suitable size. For example, the square may be 10 µm×10 µm, 20 µm×20 µm or 40 µm×40 µm. This may provide for a double sampling of a defect for each scan and also for a baseline intensity measurement of a defect in the absence of an enhancement field in a similar manner to that already described. A second exemplary pattern 1040 comprises a number of linear pattern components 1041 arranged in a one-dimensional periodic pattern that is linearly periodic in a first direction. In some implementations, the first direction is parallel to the relative direction of movement between the optical system of the inspection apparatus and the substrate during measurements. Accordingly, when the inspection apparatus is utilized to detect variations on the surface of a substrate (for example as described above with reference to FIGS. 9 and 10), each of the pattern components will pass over each point on the surface. As before, in effect, a plurality of measurements will be performed for each point on the surface of the substrate, thereby increasing the chance that a particular defect or variation is detected, thereby effectively increasing the sensitivity of the apparatus The exemplary patterns discussed above are, of course, only illustrative and not to be interpreted as limiting. Other patterns may easily be envisaged. In some examples, the pattern and/or the characteristics of individual pattern components may be modified based on one or more criteria. For example, an exemplary pattern may have a set of characteristics operable to maximize accuracy for radiation with a particular set of radiation characteristics.

Figure 10C:
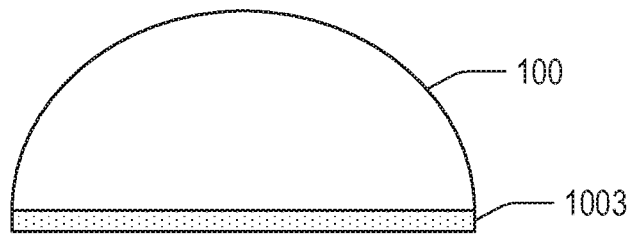

FIG. 10(c) illustrates a further implementation wherein an enhancing layer 1003 without a pattern has been applied to a surface of SIL 100. Such an enhancing layer may, for example, be used to increase the coupled signal strength of the enhanced field. Such a SIL 100 may be used in place of SIL 90, in conjunction with a patterning component 930 which patterns the inspection radiation before the SIL. Alternatively, such an enhancement layer 1003 may additionally comprise a pattern 1030 such as those illustrated in FIGS. 10(a) and 10(b), or may be additional to enhancement layer 1001. The enhancing layer 1003 may comprise a coating of the SIL 100 surface with an enhancing dielectric and/or metal deposition. The enhancing layer 1003 may be less than 50 nm thick; e.g., in the region of 20 nm. The enhancing layer 1003 can consist of a single or multi-layer system. The enhancing layer 1003 may be operable to enhance the near field interaction (evanescent wave interaction) with the defect, thereby and increasing the SNR.

A number of additional features and sub-methods may be employed to improve the functionality and/or accuracy of the above-described method and apparatus. Some of these will be discussed in detail below. It will be appreciated that the examples described in the following may without limitation be variously combined with the exemplary method and apparatus described above.

A second exemplary enhancement layer that may be patterned onto a surface of the optical component will now be described with reference to FIGS. 11 and 12. The second exemplary enhancement layer may be used as an alternative to, or in addition to, the first exemplary enhancement layer, or indeed any other suitable enhancement layers, described above.

Figure 11A:
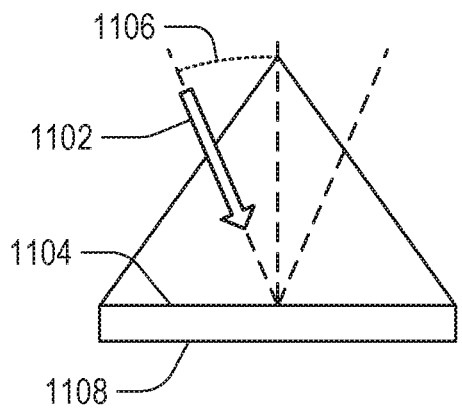
FIGS. 11(a), 11(b) and 11(c) illustrate schematically a mechanism for generating a surface plasmon in an enhancing layer usable in embodiments of the invention.
Figure 11B:
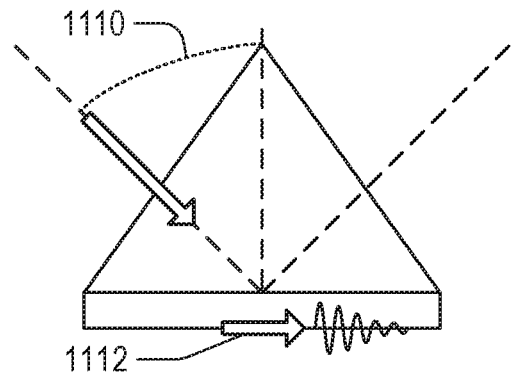
Figure 11C:
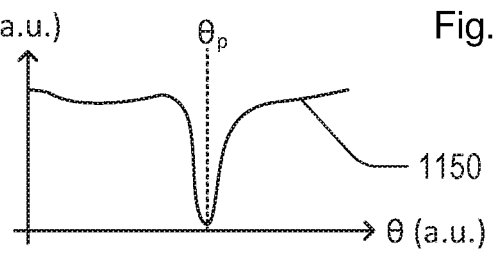
Figure 12A:
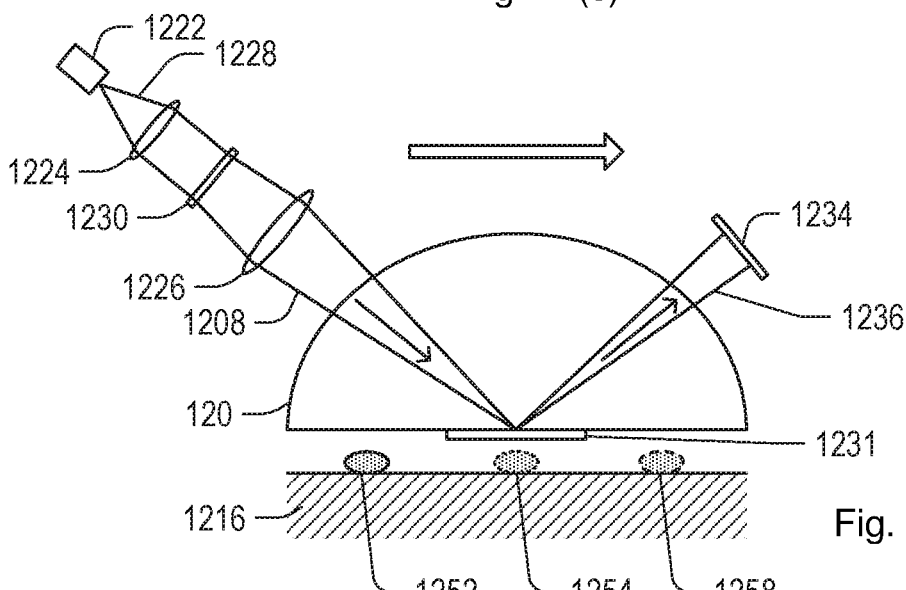
FIGS. 12(a), 12(b), 12(c) and 12(d) is a measurement apparatus utilizing the mechanism shown in FIGS. 11(a) and 11 to detect surface defects in an aspect of the present disclosure.
Figure 12B:
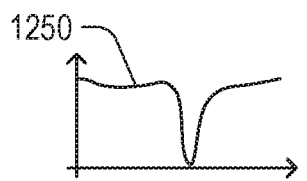
Figure 12C:
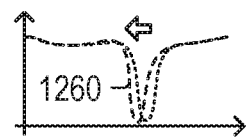
Figure 12D:
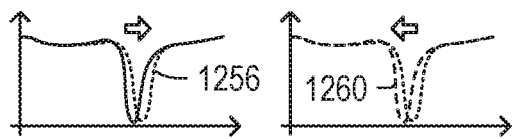

FIG. 11 illustrates schematically the principle behind the second exemplary enhancing layer. It will be appreciated that the angles shown in FIG. 11 are illustratively exaggerated for purposes of more easily illustrating the principle.

FIG. 11(a) shows incoming radiation 1102 that propagates towards an inside surface 1104 of an optical component (e.g. a SIL such as is described above) at an angle of incidence 1106 that is larger than the critical angle $\theta_c$. Accordingly, the incoming radiation is reflected by the internal surface by way of total internal reflection substantially as described above. In the present example, a second exemplary enhancing layer 1108 has been applied to an outside surface of the optical component. The enhancing layer may, for example, be a metallic layer. The enhancing layer material may, in some examples, be chosen in dependence on one or more characteristics of the radiation and/or characteristics of the optical system.

FIG. 11(b) illustrates a situation wherein the angle of incidence 1110 of the incoming radiation 1102 has been changed. In this example, the angle of incidence 1110 is larger than the angle of incidence of the situation illustrated in FIG. 11(a), although it will be appreciated that this is exemplary only. When the angle 1110 reaches a particular value (denoted in the following by $\theta_p$), or if the angle of incidence is within a specific threshold, a plasmon 1112 is generated in the enhancing layer 1108. Simultaneously, the intensity of the radiation reflected by the inside surface is reduced.

FIG. 11(*c*) illustrates the intensity 1150 of reflected radiation as a function of the angle of incidence. As can be seen, the amount of radiation that is reflected is substantially constant (for all angles of incidence that are larger than the critical angle). As the angle of incidence approaches the plasmon-generating angle $\theta_p$, the intensity of reflected radiation reduces. In some instances, the intensity may for a specific angle be substantially zero.

FIG. 12 illustrates an exemplary system that utilizes the principle shown in FIG. 11 to detect, or improve detection of, defects or other variations on the surface of a substrate. The exemplary system may be used in addition to or as an alternative to the system described above. For ease of comparison with FIG. 9, elements of FIG. 12 similar to corresponding elements of FIG. 9 are labelled with reference signs similar to those used in FIG. 9, but with prefix "12" instead of "9".

In this example, radiation 1208 is provided in a manner substantially similar to that described in the preceding examples. In other terms, radiation is provided that is totally internally reflected by an inner surface of an optical component 120 (e.g. a SIL). An enhancing layer 1231, as described with reference to FIG. 11 above, has been applied to an outside surface of the optical component 120. In the present example, the enhancing layer is applied to only a portion of the optical component, although it will be appreciated that this is exemplary only. Instead of using a beam dump as in the preceding examples, the exemplary system comprises a second detector 1234 positioned to receive radiation 1236 reflected by the optical component at a second detector, the second detector being operable to detect changes to at least one characteristic of the received radiation, the said changes being induced by the generation of a surface plasmon.

The radiation may be provided to the optical surface in any suitable fashion. In the present example, system comprises an illumination system substantially identical to that discussed with respect to FIG. 9. Furthermore, any suitable detector 1234 suitable for receiving the radiation 1236 reflected by the optical surface may be utilized. In some examples, the sensor is a CCD component adapted to receive visible or near-infrared radiation.

During operation of the apparatus, the optical system is moved in one or more directions relative to the substrate 1216 under measurement. When no defects are present (or if a defect 1252 is not located within the enhanced field), the radiation is substantially totally internally reflected, as described with reference to FIG. 11(*a*) above. In this situation, as shown in FIG. 12(*b*), the intensity 1250 of reflected radiation as a function of angle of incidence is substantially identical to shown in FIG. 11(*c*) above.

When a defect 1254 enters the enhanced field below the SIL, the enhanced field is affected by the presence of the defect. This affects the generation of the plasmon in the enhancement layer 1208 on the surface of the SIL 120. This situation is shown in FIG. 12(*c*). Specifically, the specific angle of incidence for which a plasmon is generated, i.e. the plasmon-generating angle $\theta_p$, is altered by the presence of the defect. In the present example, the plasmon-generating angle $\theta_p$ is shifted (as indicated by the arrow). This alters the intensity 1256 of reflected radiation as a function of angle of incidence. If the angle of incidence of the radiation is close to, or identical to, the unaffected plasmon-generating angle, the intensity measured at the detector 1234 will change, thereby allowing the presence of the defect to be detected.

FIG. 12(*d*) shows the situation in which the defect has moved out of the enhancing field. When this happens, the plasmon-generating angle $\theta_p$ reverts to the initial value (i.e. the intensity 1260 as a function of angle of incidence reverts to the situation shown in FIG. 12(*b*)).

It will be appreciated that the above system may be used in conjunction with the systems described above or it may be used on its own.

The above examples describe inspection apparatuses which use relatively longer wavelength measurement radiation (e.g., visible radiation). Increasingly, metrology is performed using radiation in the EUV or soft X-ray wavebands, e.g., in the wavelength range of 2 nm to 100 nm, more specifically in the range of 13.5 to 100 nm, or in the range of 13.5 nm to 50 nm. Such radiation may be preferred as it enables resolution of smaller structures. This increases sensitivity to structural variations of such small structures and/or enables penetration further into the product structures. In such a wavelength band, a (transmissive) SIL cannot be used as it would tend to absorb the EUV radiation. As such, when performing metrology using measurement radiation in the EUV or soft X-ray wavebands the concepts described above need adaptation.

Examples of radiation sources suitable for providing EUV or soft X-ray radiation include Discharge Produced Plasma sources, Laser Produced Plasma Sources or High-order Harmonic Generation (HHG) sources. HHG sources are known to be able to provide large flux of collimated photons (high luminance) in the emitted light. HHG sources used in metrology applications are illustrated and further described in the European patent applications EP152020301, EP16168237, EP16167512, which are hereby incorporated in their entirety by reference. In metrology applications, such HHG sources may be used (for example) in normal incidence, very close to normal incidence (e.g., within 10 degrees from normal), at a grazing incidence (e.g., within 20 degrees from surface), at an arbitrary angle or at multiple angles (to obtain more measurement information in a single capture).

Figure 13:
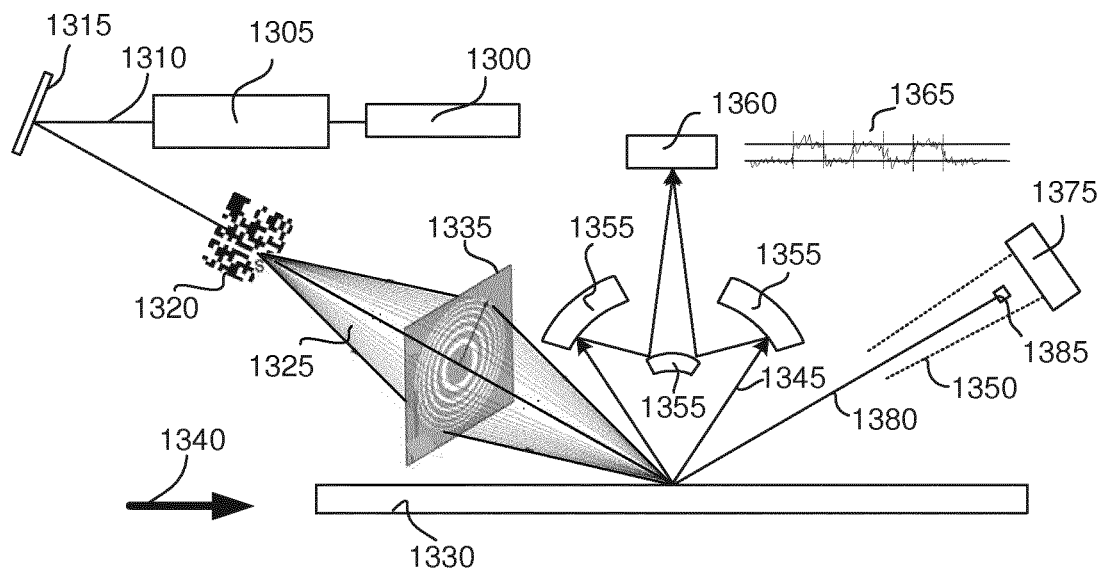
FIG. 13 schematically illustrates a measurement apparatus according to a further embodiment of the invention, usable for dark field metrology.

FIG. 13 illustrates a proposed metrology apparatus and arrangement for surface variation (e.g., defect) detection on a substrate. It shows an illumination source comprising a seed laser 1300 and HHG generation medium 1305, which generates HHG measurement radiation 1310 having one or more wavelengths within in one or more of the wavebands mentioned above. This measurement radiation 1310 is filtered by a (e.g., 50 nm) filter 1315, before being patterned by patterning component 1320 (e.g., a coded mask). The patterning component 1320 may be similar to any already previously described and/or illustrated (e.g., as illustrated in FIG. 9 or 10). The patterned measurement radiation 1325 is then focused onto the substrate 1330 via condenser optics 1335. Condenser optics 1335 may comprise, for example, diffractive (e.g., a zone plate as illustrated) or reflective (specular or grazing) optics.

This illumination mode improves the signal to noise characteristics of the signal by increasing the scanned field and therefore the amount of light. By increasing the signal to noise ratio, smaller particles can be detected. The direction of scanning is, in this example, indicated by arrow 1340. The scanned field is enhanced by being modulated by the pattern imparted by patterning component 1320. Multiple sampling and synchronous detection to the patterning component code (or deconvolution of the patterning component pattern) increases the total amount of signal detected and decreases and the amount of noise. More specifically, synchronous detection while scanning the surface enables more accurate localization of any defect. As the coded patterning component is imaged onto the substrate 1330 surface (in focus) when the pattern is scanned over the surface, any defect will "see" and scatter the coded intensity pattern. By correlating this scattered radiation 1345 (and optionally the forward scattered radiation 1350), with the position signal(s) used by the position sensors in positioning the substrate relative to the optical system, defect localization information may be determined.

The scattered radiation 1345 may be captured over a large range of angles using reflective optics 1355 which may comprise two reflectors in Schwarzschild and/or inverted Cassgrain configuration. If an appropriate wavelength is chosen, e.g. between 50 and 100 nm, the reflective optics 1355 may comprise simple Carbon or BoriumCarbide (B4C) mirrors having a single layer coating. Therefore, the main cost would only be in obtaining their macroscopic shape and micro smoothness. It can be shown that the scattered radiation from tiny particles (of an order of magnitude expected for defects) is predominately Mie and/or Rayleigh scattering. The optical resolution of the reflective optics 1355 need only be sufficient to resolve the coded patterning component; it is not required that the resolution be able to image the surface defects/variations being detected. The high NA of the collection optics 1355 will provide sufficient sensitivity. This scattered radiation 1345 can then be detected in the dark field by detector 1360 to derive signal 1365. In addition, the forward scattered radiation 1350 may be used in the defect detection. This forward scattered radiation 1350 (e.g., Mie scattered radiation) may be captured by a further detector 1375, with the specular, zeroth order component 1380 blocked by beam stop 1385.

Figure 14:
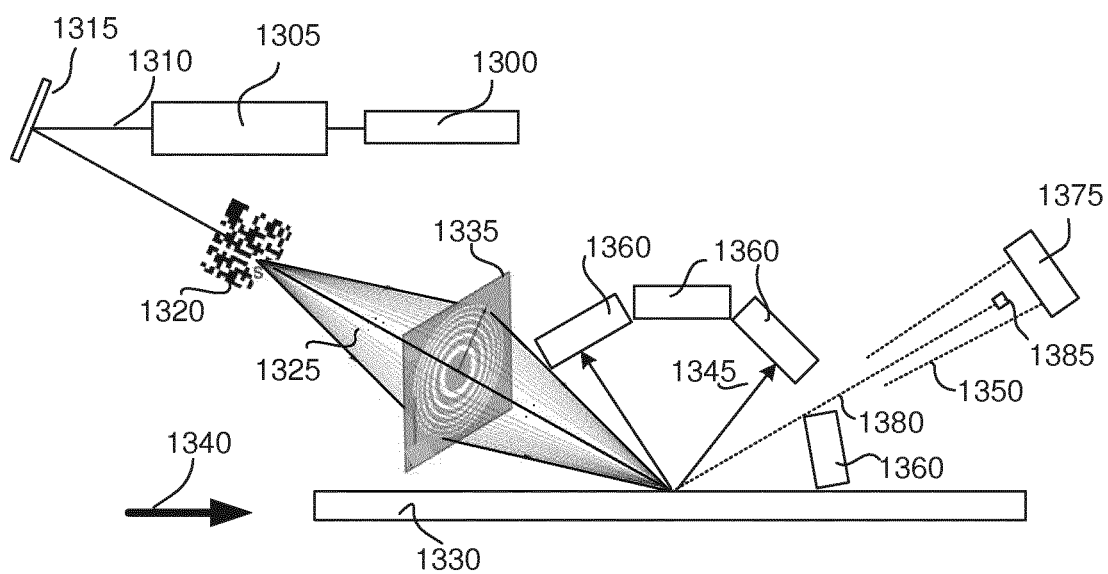
FIG. 14 schematically illustrates a measurement apparatus according to a yet further embodiment of the invention.

An alternative arrangement is shown in FIG. 14, which replaces the reflective optics 1355 with a plurality of detectors 1360 covering all, or a large proportion of, the scattering directions. Though only shown in two-dimensions, the plurality of detectors 1360 may be, in fact, arranged in a dome configuration. As such, the signal can be treated as an angle resolved, pupil plane detector signal; e.g., in a similar manner to the previous embodiments described in relation with the angle resolved scatterometer of FIG. 5. As such, the plurality of detectors 1360 operates as a high NA pupil plane detector.

In many of the examples discussed above, a system comprising a single optical component (e.g. a SIL) is used. However, under certain circumstances it may be advantageous or desirable to utilize a plurality of optical components simultaneously.

Figure 15A:
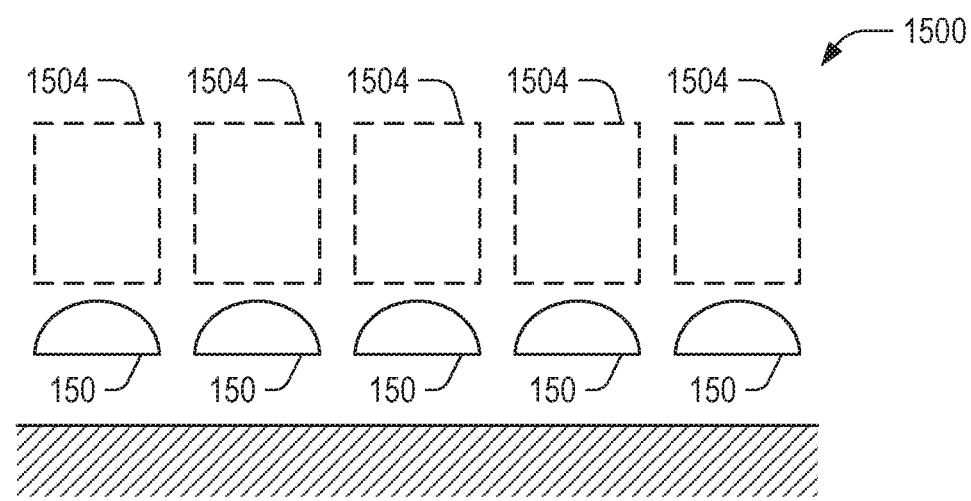
FIGS. 15(a) and 15(b) show a plurality of individual optical systems used in aspects of the present disclosure.

An exemplary system, in which a plurality of optical components is used, will now be discussed with reference to FIG. 15.

In this example, there is provided an inspection apparatus 1500, the inspection apparatus comprising at least one illumination system operable to provide a plurality of patterned inspection radiations; a plurality of optical components 150, each optical component arranged to receive one of the plurality of patterned inspection radiations, wherein each of the plurality of optical components is operable to use the received patterned inspection radiation to generate a corresponding enhanced field at a substrate surface; and at least one first detector operable to detect scattered radiation caused by a plurality of interactions between each of the generated enhanced fields and the substrate surface.

In the present example, radiation is provided to each of the optical components by way of a separate radiation delivery and reception system 1504. The optical component may be any suitable optical component for focusing radiation onto, and receiving scattered radiation from, a substrate surface. In an example, the optical component is a SIL, as substantially described in the examples above (e.g., one or more of: SIL 90, SIL 100 and SIL 120). Each of the radiation delivery and reception systems may, similarly, take any suitable form. For example, each one may be substantially similar to those described with reference to the Figures above.

Figure 15B:
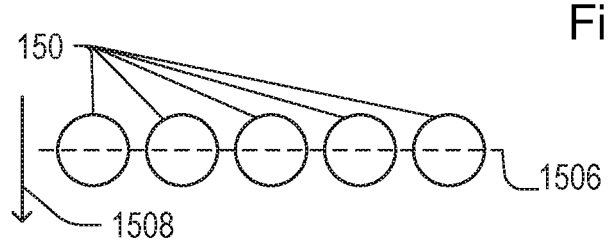

By utilizing a plurality of optical systems in combination, it is possible to reduce the overall amount of time required to perform measurements on a substrate. FIG. 15(b) illustrates an example where the plurality of optical systems are arranged in a linear configuration along an axis 1506 that is perpendicular to a relative movement direction 1508 of the optical systems relative to a substrate under measurement. This configuration allows the area covered during a single movement to be maximized, thereby reducing the time required to perform a measurement on a substrate. It will be appreciated, of course, that a plurality of alternative configurations could be envisaged within the scope of the present disclosure. In an embodiment, the scanning may be performed in two stages: as a first coarse scan followed by a second fine scan.

Each of the optical systems can provide any suitable radiation pattern to the surface of the substrate under measurement. In some examples, each of the optical systems provides substantially the same radiation pattern. In other examples, one or more of the optical systems provide a different radiation pattern than at least one of the other optical systems. This could, for example, be advantageous if it is desired to use one or more of the optical systems to perform a measurement directed towards one or more specific characteristics. In some examples, the radiation patterns provided to the surface of the substrate may be changed periodically or in dependence on one or more requirements or other characteristics. It yet other examples, each of the optical systems provides a unique radiation pattern to the surface of the substrate. In a specific example, the optical systems are arranged in a linear configuration along an axis that is parallel (rather than perpendicular) to the relative movement direction between the optical systems and the substrate. In this example, each point on the surface of the substrate is measured a plurality of times, each one with a unique radiation pattern, thereby increasing the accuracy and sensitivity of the measurement process.

It should be noted than in an embodiment, instead of patterning the inspection radiation using a patterning component between radiation source and SIL (or SILs), or a patterning component integrated with the SIL (or SILs), the patterning of the inspection radiation may be performed using a plurality of SILs in a linear configuration or 2-dimensional array, with one dimension along an axis that is parallel to the relative movement direction between the optical systems and the substrate. In this manner, the pattern can be imparted by each different radiation delivery and reception system 1304 either being "on" or "off" (either literally or having their beam blocked in some manner, whether it be at each SIL or anywhere upstream) so as to define the pattern. This results in a corresponding modulation of the enhanced field immediately below the SILs.

FIG. 16 illustrates an alternative parallel arrangement to that described immediately above. FIG. 16 illustrates a proposed parallel inspection arrangement which uses near-field scanning optical microscopy (NSOM/SNOM). NSOM is a microscopy technique for nanostructure investigation which breaks the far field resolution limit by exploiting the properties of evanescent waves. This is done by placing the optical microscopy detector very close (distance much smaller than wavelength λ) to the specimen surface. This allows for the surface inspection with high spatial, spectral and temporal resolving power. With this technique, the resolution of the image is limited by the size of the optical microscopy detector aperture and not by the wavelength of the illuminating light. In particular, lateral resolution of 20 nm and vertical resolution of 2-5 nm have been demonstrated.

This embodiment, as with the other embodiments described previously, may be particularly suitable for inspection of blank EUV reticles. Blank EUV reticles are, essentially, glass plates or substrates with an EUV-reflective coating; the mask pattern is applied on top of the blank. Methods for detecting surface defects in uncoated EUV substrates are very limited; in practice, defects of 10 nm in diameter and 1 nm in depth can only be detected after application of the reflective coating. The coating process is very expensive, yet only about 40% of the blanks can be used due to defects. Very significant cost saving can be made, therefore, if defects could be detected on the uncoated glass surface. Even for coated reticle blanks, costs could be reduced using such a method.

Figure 16A:
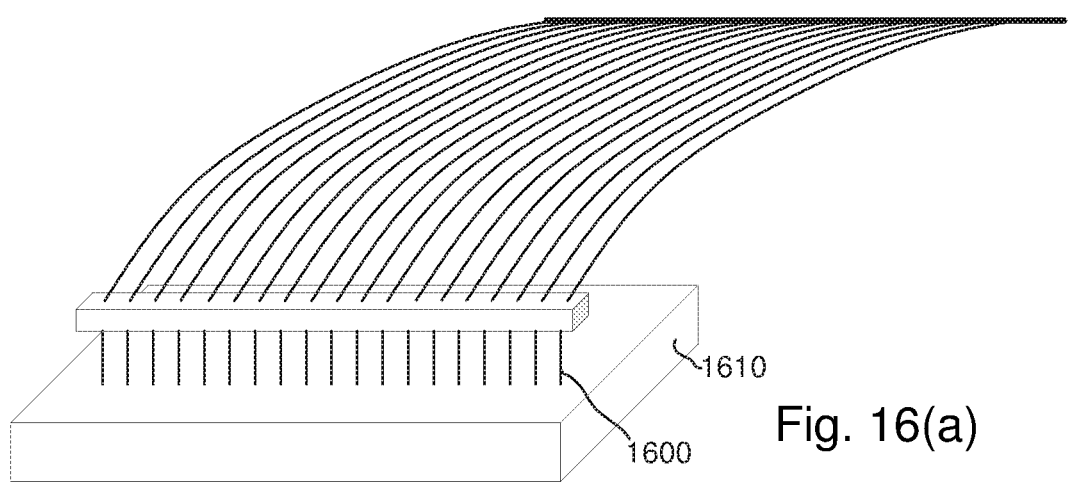
FIGS. 16(a) and 16(b) illustrate an alternative metrology apparatus which uses near-field scanning optical microscopy.
Figure 16B:
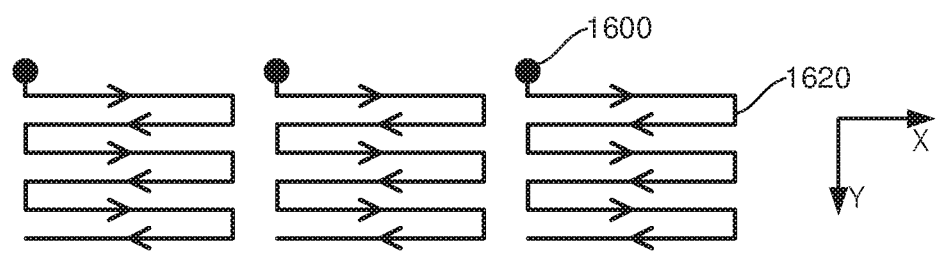

FIG. 16(a) shows a plurality or array of optical microscopy detectors, e.g., fiber tips 1600. In an embodiment, the array of optical microscopy detectors 1600 operate to illuminate the substrate 1610 surface and to detect the resultant backscattered light. While single-fiber NSOM may be too slow for reticle inspection, using a parallel array of fiber tips 1600 as illustrated enables measurements to be parallelized. An example scan pattern is illustrated in FIG. 16(b), in which the array (and therefore each fiber tip 1600, only three being shown) meanders in a zig-zag path 1620. Such a scan pattern ensures that the entire surface is scanned, even though the distance between the fiber tips is much larger than the spatial resolution of an individual tip. This is only one example of a scan pattern, and other suitable scan patterns for scanning the whole substrate surface are possible. For example, another scan pattern may comprise scanning the entire substrate in a straight line, then jumping back to the beginning and rescanning with a slight offset. In a practical embodiment, the entire array may be located on a "long stroke" stage, for positioning in the X-Y plane. The Z position (normal to the surface) may be actuated for individual fibers, using, for example, a Microelectromechanical (MEMS) system.

Various alternative illumination and detection schemes can be considered, as per the state of the art in NSOM technology. For example, detection schemes may comprise phase-sensitive detection, either in combination with or as an alternative to intensity based detection methods. Additionally, while the optical microscopy detectors 1600 are described as providing the illumination, other illumination schemes are envisaged. For example, the optical microscopy detectors 1600 may be configured only for detection, with illumination being effected, for example, by back-illumination through the glass plate (blank reticle).

Further embodiments are provided in the subsequent numbered clauses:
1. A method for detecting variations on a surface of a substrate, the method comprising:
   providing inspection radiation to a surface of a substrate wherein the inspection radiation is patterned such that an amplitude of a corresponding enhanced field is modulated in a manner corresponding to the patterned inspection radiation;
   receiving scattered radiation resultant from interaction between the enhanced field and the substrate surface; and
   detecting variations on the surface of the substrate based on the interaction between the enhanced field and the substrate surface.
2. A method according to clause 1, wherein the enhanced field is an evanescent field.
3. A method according to clause 2; and the method further comprises:
   providing the inspection radiation to the surface of the substrate via an optical element and at an angle configured to create the evanescent field; and
   positioning a surface of the optical element within a distance smaller than a wavelength of the patterned inspection radiation to the surface of the substrate.
4. A method according to clause 3, wherein the optical element is a solid immersion lens.
5. A method according to clauses 3 or 4, wherein the surface of the optical element is positioned at a first distance from the substrate such that the evanescent field is generated by total internal reflection of the patterned radiation at the surface of the optical element in the absence of any significant variation on the surface of the substrate in an area of the substrate being inspected.
6. A method according to any of clauses 3 to 5, further comprising:
   receiving radiation reflected by the optical element;
   detecting any changes to at least one characteristic of the received radiation, the said changes being induced by the generation of a surface plasmon at said surface of the optical element.
7. A method according to clause 6, comprising:
   detecting a change in an incident angle of the inspection radiation on the substrate at which a surface plasmon is generated from said characteristic of the received radiation; and
   determining a presence of a variation on the surface of the substrate based on said detection of a change in an incident angle.
8. A method according to clause 7, wherein said detecting a change in an incident angle of the inspection radiation on the substrate at which a surface plasmon is generated from said characteristic of the received radiation comprises determining a change in position of a drop in detected intensity of the received radiation indicative of said optical element not reflecting said inspection radiation.
9. A method according to any of clauses 3 to 8, wherein said surface of said optical element comprises an enhancing dielectric and/or metal deposition.
10. A method according to any of clauses 3 to 9, wherein said optical element comprises a plurality of such optical elements arranged in an array.
11. A method according to clause 10, wherein and said patterned inspection radiation is obtained by providing separate beams of said inspection radiation to respective surfaces of a subset of the plurality of optical elements, said subset corresponding to a desired pattern.
12. A method according to clause 10, wherein said patterned inspection radiation is obtained by providing said inspection radiation to respective surfaces of the plurality of optical elements arranged in an array, said plurality of optical elements being operable to pattern said inspection radiation.

13. A method according to any of clauses 3 to 9, wherein said patterned inspection radiation is obtained by providing the inspection radiation to the surface of the optical element, wherein the optical element has a first pattern thereon operable to pattern the inspection radiation.

14. A method according to any of clauses 3 to 9, wherein the step of providing comprises:
providing an input inspection radiation;
patterning the input inspection radiation by using a patterning component comprising a first pattern to obtain said patterned inspection radiation, wherein said first pattern is focused on said surface of the optical element.

15. A method according to clause 1, wherein the step of providing comprises:
providing an input inspection radiation;
patterning the input inspection radiation by using a patterning component comprising a first pattern to obtain said patterned inspection radiation;
focusing the patterned inspection radiation on the substrate; and
using a detection arrangement to capture the scattered radiation over a range of scattering angles.

16. A method according to clause 15, wherein the detection arrangement comprises reflective optics arranged in a Schwarzschild and/or inverted Cassgrain configuration focused on a detector.

17. A method according to clause 15, wherein the detection arrangement comprises a plurality of detectors positioned to capture the scattered radiation over the range of scattering angles.

18. A method according to clause 17, wherein the plurality of detectors are arranged in a dome configuration around the point on which the patterned inspection radiation is focused.

19. A method according to any of clauses 15 to 18, comprising a forward scatter detector for detecting the scattered radiation around the zeroth order axis, wherein the zeroth order radiation is blocked.

20. A method according to any of clauses 15 to 19 wherein said inspection radiation comprises a wavelength between 2 nm and 100 nm.

21. A method according to any of clauses 13 to 20, wherein the first pattern is a periodic pattern.

22. A method according to clause 21, wherein the periodic pattern is linearly periodic in at least a first direction.

23. A method according to clause 22, wherein the first direction is parallel to a relative movement between the lithographic apparatus and the substrate.

24. A method according to any of clauses 13 to 20, wherein the first pattern is an aperiodic pattern.

25. A method according to any of clauses 21 to 24, wherein the first pattern is a two dimensional pattern.

26. A method according to any preceding clause, comprising providing a relative movement in a first direction between the patterned inspection radiation and the substrate; and
processing the received scattered radiation to determine the presence of variations on the surface of the substrate from said received scattered radiation.

27. A method according to clause 26, wherein said received scattered radiation comprises a signal corresponding to a variation detected on said surface of the substrate, and wherein said processing step comprises identifying a plurality of samples within the signal as determined by the modulation of the enhanced field, each sample corresponding to the same said variation.

28. A method according to clause 27, wherein said processing comprises obtaining an average of said plurality of samples.

29. A method according to clause 27 or 28, comprising performing an autocorrelation analysis on said plurality of samples.

30. A method according to any of clauses 27 to 29, wherein said processing comprises determining a baseline measurement of the variation in the absence of an enhanced field from the signal level at troughs within the signal.

31 A method according to any of clauses 27 to 30, wherein processing the received scattered radiation comprises deconvolving the first pattern used to pattern the inspection radiation.

32. A method according to any preceding clause, wherein the inspection radiation is patterned by patterning at least the intensity of the inspection radiation.

33. A method according to any preceding clause, wherein the inspection radiation is patterned by patterning at least one of: the polarization and the phase of the inspection radiation.

33. A method according to any preceding clause, wherein said receiving scattered radiation comprises detecting the scattered radiation at an image plane.

35. A method according to any of clauses 1 to 33, wherein said receiving scattered radiation comprises detecting the scattered radiation at a pupil plane.

36. A method for detecting variations on a surface of a substrate, the method comprising:
providing inspection radiation to a surface of an optical element at an angle configured to create an enhanced field;
positioning the surface of the optical element within a distance smaller than a wavelength of the patterned inspection radiation to the surface of the substrate;
receiving said inspection radiation following reflection by the optical element; and
detecting any changes to at least one characteristic of the received radiation, the said changes being induced by the generation of a surface plasmon at said surface of the optical element.

37. A method according to clause 36, comprising:
detecting a change in an incident angle of the inspection radiation on the substrate at which a surface plasmon is generated from said characteristic of the received radiation; and
determining a presence of a variation on the surface of the substrate based on said detection of a change in an incident angle.

38. A method according to clause 37, wherein said detecting a change in an incident angle of the inspection radiation on the substrate at which a surface plasmon is generated from said characteristic of the received radiation comprises determining a change in position of a drop in detected intensity of the received radiation indicative of said optical element not reflecting said inspection radiation.

39. An inspection apparatus for detecting variations on a surface of a substrate, the apparatus comprising:
an illumination system operable to provide an inspection radiation;
patterning means configured to pattern the inspection radiation such that an amplitude of a corresponding enhanced field is modulated in a manner corresponding to the patterned inspection radiation; and a first detector operable to detect scattered radiation caused by interaction between the patterned enhanced field and the substrate surface.

40. An inspection apparatus according to clause 39, wherein the enhanced field is an evanescent field.

41. An inspection apparatus according to clause 40, comprising an optical element having a surface positioned within a distance smaller than a wavelength of the patterned inspection radiation from the surface of the substrate, and operable to use the inspection radiation to generate the evanescent field at said surface of the optical component.

42. An inspection apparatus according to clause 41, wherein the optical element is a solid immersion lens.

43. An inspection apparatus according to clause 41 or 42, wherein the surface of the optical element is located at a first distance from the substrate such that the enhanced field is generated by total internal reflection of the patterned inspection radiation at the surface of the optical element in the absence of any significant variation on the surface of the substrate in an area of the substrate being inspected.

44. An inspection apparatus according to any of clauses 41 to 43, wherein said detector is further operable to detect radiation reflected from the optical element; and said inspection apparatus is further operable to detect any changes to at least one characteristic of the received radiation, said changes being induced by the generation of a surface plasmon at said surface of the optical element.

45. An inspection apparatus according to clause 44, being operable to:
   detect a change in an incident angle of the inspection radiation on the substrate at which a surface plasmon is generated from said characteristic of the received radiation; and
   determine a presence of a variation on the surface of the substrate based on said detection of a change in an incident angle.

46. An inspection apparatus according to clause 45, being operable to determine a change in position of a drop in detected intensity of the received radiation indicative of said optical element not reflecting said inspection radiation.

47. An inspection apparatus according to any of clauses 41 to 46, wherein said surface of said optical element comprises an enhancing dielectric and/or metal deposition.

48. An inspection apparatus according to any of clauses 41 to 47, wherein said optical element comprises a plurality of such optical elements arranged in an array.

49. An inspection apparatus according to clause 48, being operable to provide separate beams of said inspection radiation to respective surfaces of a subset of the plurality of optical elements, said subset corresponding to a desired pattern, to generate said patterned inspection radiation.

50. An inspection apparatus according to clause 48, being operable to provide said inspection radiation to respective surfaces of the plurality of optical elements arranged in an array, said plurality of optical elements being operable to pattern said inspection radiation.

51. An inspection apparatus according to any of clauses 41 to 47, wherein said surface of the optical element comprises a first pattern thereon operable to pattern the inspection radiation.

52. An inspection apparatus according to any of clauses 41 to 47, further comprising a patterning component having a first pattern for patterning said inspection radiation, said patterning component being located between the illumination system and the optical element, and wherein the illumination system is operable to focus the first pattern on said surface of the optical element.

53. An inspection apparatus according to clause 39, further comprising:
   a patterning component having a first pattern for patterning said inspection radiation, said patterning component being located between the illumination system and the substrate;
   a focusing element for focusing the patterned inspection radiation on the substrate; and
   a detection arrangement operable to capture the scattered radiation over a range of scattering angles.

54. An inspection apparatus according to clause 53, wherein the detection arrangement comprises reflective optics arranged in a Schwarzschild and/or inverted Cassgrain configuration focused on a detector.

55. An inspection apparatus according to clause 53, wherein the detection arrangement comprises a plurality of detectors positioned to capture the scattered radiation over the range of scattering angles.

56. An inspection apparatus according to clause 55, wherein the plurality of detectors are arranged in a dome configuration around the point on which the patterned inspection radiation is focused.

57. An inspection apparatus according to any of clauses 53 to 56, comprising a forward scatter detector for detecting the scattered radiation around the zeroth order axis, wherein the zeroth order radiation is blocked.

58. An inspection apparatus according to any of clauses 53 to 57, wherein said inspection radiation comprises a wavelength between 2 nm and 100 nm 59. An inspection apparatus according to any of clauses 50 to 58, wherein the first pattern is a periodic pattern.

60. An inspection apparatus according to clause 59, wherein the periodic pattern is linearly periodic in at least a first direction.

61. An inspection apparatus according to clause 60, wherein the first direction is parallel to a relative movement between the lithographic apparatus and the substrate.

62. An inspection apparatus according to any of clauses 50 to 58, wherein the first pattern is an unperiodic pattern.

63. An inspection apparatus according to any of clauses 59 to 62, wherein the first pattern is a two dimensional pattern.

64. An inspection apparatus according to any of clauses 38 to 47, being operable to provide a relative movement in a first direction between the patterned inspection radiation and substrate, said inspection apparatus further comprising a processor operable to process the received scattered radiation and determine the presence of variations on the surface of the substrate from said received scattered radiation.

65. An inspection apparatus according to clause 64, wherein said received scattered radiation comprises a signal corresponding to a variation detected on said surface of the substrate, and wherein said processor is operable to identify a plurality of samples within the signal as determined by the modulation of the enhanced field, each sample corresponding to the same said variation.

66. An inspection apparatus according to clause 65, wherein said processor is operable to determine an average of said plurality of samples.

67. An inspection apparatus according to clause 65 or 66, wherein said processor is operable to perform an auto-correlation analysis on said plurality of samples.

68. An inspection apparatus according to any of clauses 65 to 67, wherein said processor is operable to determine a baseline measurement of the variation in the absence of an enhanced field from the signal level at troughs within the signal.
69. An inspection apparatus according to any of clauses 65 to 68, wherein said processor is operable to deconvolve the first pattern used to pattern the inspection radiation.
70. An inspection apparatus according to any of clauses 38 to 58, operable such that the inspection radiation is patterned by patterning at least the intensity of the inspection radiation.
71. An inspection apparatus according to any of clauses 38 to 70, operable such that the inspection radiation is patterned by patterning at least one of: the polarization and the phase of the inspection radiation.
72. An inspection apparatus according to any of clauses 38 to 71, wherein said detector is located at an image plane.
73. An inspection apparatus according to any of clauses 38 to 71, wherein said detector is located at a pupil plane.
74. An inspection apparatus for detecting variations on a surface of a substrate, the inspection apparatus comprising:
an optical element;
an illumination system operable to provide an inspection radiation to a surface of the optical element at an angle configured to create an enhanced field;
a first detector operable to detect received radiation caused by interaction between the patterned evanescent field and the substrate surface; and
processing means being operable to detect any changes to at least one characteristic of the received radiation, the said changes being induced by the generation of a surface plasmon at said surface of the optical element.
75. An inspection apparatus according to clause 74, wherein said processing means is operable to:
detect a change in an incident angle of the inspection radiation on the substrate at which a surface plasmon is generated from said characteristic of the received radiation; and
determine a presence of a variation on the surface of the substrate based on said detection of a change in an incident angle.
76. An inspection apparatus according to clause 75, wherein said processing means is operable to detect a change in an incident angle of the inspection radiation on the substrate at which a surface plasmon is generated by determining a change in position of a drop in detected intensity of the received radiation indicative of said optical element not reflecting said inspection radiation.
77. A near-field scanning optical microscopy method for detecting variations on a surface of a substrate, the method comprising:
providing inspection radiation to a surface of a substrate; and
detecting resultant scattered radiation having scattered from the substrate, wherein said detecting is performed from within a distance, relative to the surface of the substrate, smaller than a wavelength of the inspection radiation, thereby creating an evanescent field.
78. The method according to clause 77, wherein said detecting step is performed using an array of optical microscopy detectors.
79. The method according to clause 78, wherein said array of optical microscopy detectors comprises a 1-dimensional array of optical microscopy detectors.
80. The method according to clause 78 or 79, wherein the array of optical microscopy detectors is scanned across the substrate surface in a pattern which substantially scans the entire substrate surface.
81. The method according to clause 78, 79 or 80, wherein the array of optical microscopy detectors is scanned across the substrate surface in a meandering path.
82. The method according to any of clauses 78 to 81, wherein each optical microscopy detector comprises a fiber tip.
83. The method according to any of clauses 78 to 82, wherein each optical microscopy detector also provides the illumination radiation.
84. The method according to any of clauses 78 to 83, wherein the substrate is an EUV reticle blank.
85. The method according to clause 84, wherein the EUV reticle blank comprises an uncoated EUV reticle blank, not yet having had a reflective coating applied.
86. A near-field scanning optical microscopy apparatus for detecting variations on a surface of a substrate, the apparatus comprising:
an illumination system for providing inspection radiation to a surface of a substrate; and
an array of optical microscopy detectors for detecting resultant scattered radiation having scattered from the substrate, wherein said array of optical microscopy detectors is located when in use, within a distance, relative to the surface of the substrate, smaller than a wavelength of the inspection radiation, thereby creating an evanescent field.
87. The apparatus according to clause 86, wherein said array of optical microscopy detectors comprises a 1-dimensional array of optical microscopy detectors.
88. The apparatus according to clause 86 or 87, being operable to scan the array of optical microscopy detectors in a pattern which substantially scans the entire substrate surface.
89. The apparatus according to clause 86, 87 or 88, being operable to scan the array of optical microscopy detectors across the substrate surface in a meandering path.
90. The apparatus according to any of clauses 86 to 89, wherein each optical microscopy detector comprises a fiber tip.
91. The apparatus according to any of clauses 86 to 90, wherein said illumination system is comprised within the array of optical microscopy detectors, such that each optical microscopy detector also provides the illumination radiation.
92. The method according to clause 1 or 2 comprising a near-field scanning optical microscopy method, wherein:
said step of providing inspection radiation comprises using an array of optical microscopy detectors, each optical microscopy detector providing the illumination radiation; and
said step of receiving scattered radiation comprises using the array of optical microscopy detectors to receive said scattered radiation from within a distance, relative to the surface of the substrate, smaller than a wavelength of the inspection radiation, thereby creating the enhanced field.
93. A method according to clause 92, wherein said radiation is patterned by controlling the illumination provided by each optical microscopy detector on an individual or subset basis.
94. The method according to clause 93, wherein said array of optical microscopy detectors comprises a 1-dimensional array of optical microscopy detectors.

95. The method according to clause 93 or 94, wherein the array of optical microscopy detectors is scanned across the substrate surface in a pattern which substantially scans the entire substrate surface.
96. The method according to clause 93, 94 or 95, wherein the array of optical microscopy detectors is scanned across the substrate surface in a meandering path.
97. The method according to any of clauses 93 to 96, wherein each optical microscopy detector comprises a fiber tip.
98. The method according to any of clauses 93 to 97, wherein the substrate is an EUV reticle blank.
99. The method according to clause 98, wherein the EUV reticle blank comprises an uncoated EUV reticle blank, not yet having had a reflective coating applied.
100. A lithographic cell comprising the inspection apparatus according to clause 39 or the near-field scanning optical microscopy apparatus according to clause 86.

In all the embodiments above, the substrate on which surface variations are being detected may be a substrate or wafer on which an integrated circuit is being applied. Alternatively the substrate may be a substrate or blank for a reticle or mask, e.g., a reflective EUV-mask. In other embodiments, the substrate may be for a different application, e.g., a display.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Although specific reference is made in this text to "metrology apparatus" or "inspection apparatus", both terms may also refer to an inspection apparatus or an inspection system. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
providing, via an optical element comprising a plurality of such optical elements arranged in an array, inspection radiation to a surface of a substrate wherein the inspection radiation is patterned such that an amplitude of a corresponding enhanced field is modulated in a manner corresponding to the patterned inspection radiation;
receiving scattered radiation resultant from an interaction between the enhanced field and the substrate surface;
detecting variations on the surface of the substrate based on the interaction between the enhanced field and the substrate surface; and
obtaining the patterned inspection radiation by providing separate beams of the inspection radiation to respective surfaces of a subset of the plurality of optical elements, the subset corresponding to a desired pattern.

2. The method of claim 1, wherein the enhanced field is an evanescent field.

3. The method of claim 2, further comprising:
providing the inspection radiation to the surface of the substrate at an angle configured to create the evanescent field; and
positioning a surface of the optical element within a distance smaller than a wavelength of the patterned inspection radiation to the surface of the substrate.

4. The method of claim 3, wherein the optical element is a solid immersion lens.

5. The method of claim 3, wherein the surface of the optical element is positioned at a first distance from the substrate such that the evanescent field is generated by total internal reflection of the patterned radiation at the surface of the optical element in the absence of any significant variation on the surface of the substrate in an area of the substrate being inspected.

6. The method of claim 3, further comprising:
receiving radiation reflected by the optical element; and
detecting any changes to at least one characteristic of the received radiation, the changes being induced by the generation of a surface plasmon at the surface of the optical element.

7. The method of claim 6, further comprising:
detecting a change in an incident angle of the inspection radiation on the substrate at which a surface plasmon is generated from a characteristic of the received radiation; and
determining the presence of a variation on the surface of the substrate based on a detection of a change in an incident angle,
wherein, the detecting the change in the incident angle of the inspection radiation on the substrate at which a surface plasmon is generated from the characteristic of the received radiation comprises determining a change in position of a drop in detected intensity of the received radiation indicative of the optical element not reflecting the inspection radiation.

8. The method of claim 3, wherein the surface of the optical element comprises an enhancing dielectric and/or metal deposition.

9. The method of claim 3, wherein:
the patterned inspection radiation is obtained by providing the inspection radiation to the surface of the optical element, and the optical element has a first pattern thereon operable to pattern the inspection radiation.

10. The method of claim 3, wherein the providing comprises:
providing an input inspection radiation; and
patterning the input inspection radiation by using a patterning component comprising a first pattern to obtain the patterned inspection radiation, wherein the first pattern is focused on the surface of the optical element.

11. The method of claim 1, wherein the providing comprises:
providing an input inspection radiation;
patterning the input inspection radiation by using a patterning component comprising a first pattern to obtain the patterned inspection radiation;
focusing the patterned inspection radiation on the substrate; and
using a detection arrangement to capture the scattered radiation over a range of scattering angles.

12. The method of claim 1, wherein:
the providing comprises using an array of optical microscopy detectors, each optical microscopy detector providing the illumination radiation; and
the receiving comprises using the array of optical microscopy detectors to receive the scattered radiation from within a distance, relative to the surface of the substrate, smaller than a wavelength of the inspection radiation, thereby creating the enhanced field.

13. The method of claim 1, further comprising:
positioning a surface of an optical element configured to provide the inspection radiation within a distance smaller than a wavelength of the patterned inspection radiation to the surface of the substrate.

14. An inspection apparatus comprising:
an illumination system operable to provide an inspection radiation, the illumination system including an optical element comprising a plurality of such optical elements arranged in an array;
patterning means configured to pattern the inspection radiation such that an amplitude of a corresponding enhanced field is modulated in a manner corresponding to the patterned inspection radiation, the patterning means include providing separate beams of the inspection radiation to respective surfaces of a subset of the plurality of optical elements, the subset corresponding to a desired pattern; and
a detector operable to detect scattered radiation caused by an interaction between the patterned enhanced field and the substrate surface.

* * * * *